United States Patent
Onuki et al.

(10) Patent No.: US 12,176,368 B2
(45) Date of Patent: Dec. 24, 2024

(54) PHOTOELECTRIC CONVERSION APPARATUS, PHOTOELECTRIC CONVERSION SYSTEM, AND MOVING BODY

(71) Applicant: CANON KABUSHIKI KAISHA, Tokyo (JP)

(72) Inventors: Yusuke Onuki, Kanagawa (JP); Junji Iwata, Tokyo (JP); Yasushi Matsuno, Kanagawa (JP); Hajime Ikeda, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 543 days.

(21) Appl. No.: 17/511,382

(22) Filed: Oct. 26, 2021

(65) Prior Publication Data

US 2022/0139985 A1 May 5, 2022

(30) Foreign Application Priority Data

Oct. 29, 2020 (JP) .................................. 2020-181379
Jan. 22, 2021 (JP) .................................. 2021-008443

(51) Int. Cl.
*H01L 27/146* (2006.01)
*B60R 11/04* (2006.01)

(52) U.S. Cl.
CPC .. *H01L 27/14623* (2013.01); *H01L 27/14645* (2013.01); *B60R 11/04* (2013.01)

(58) Field of Classification Search
CPC ......... H01L 27/14623; H01L 27/14645; H01L 27/14643
See application file for complete search history.

(56) References Cited

U.S. PATENT DOCUMENTS

| 2002/0158294 A1 | 10/2002 | Fujiwara |
| 2006/0012838 A1 | 1/2006 | Ovsiannikov |
| 2007/0290245 A1 | 12/2007 | Unagami |

(Continued)

FOREIGN PATENT DOCUMENTS

| CN | 113473050 A | 10/2021 |
| JP | 2000196055 A | 7/2000 |

(Continued)

*Primary Examiner* — John A Bodnar
(74) *Attorney, Agent, or Firm* — Canon U.S.A., Inc. IP Division

(57) ABSTRACT

A photoelectric conversion apparatus includes a first substrate having a first semiconductor device layer including a plurality of photoelectric conversion units and a well, and a second substrate having a second semiconductor device layer including a circuit configured to process signals obtained by the plurality of photoelectric conversion units, wherein the first and second substrates are laminated together, wherein the first semiconductor device layer includes an effective pixel region, an optical black pixel region, and an outer periphery region, wherein, in a planar view, a light-blocking region formed by a light-blocking layer overlaps the optical black pixel region, and the light-blocking region does not overlap the outer periphery region, wherein the outer periphery region has a charge draining region including a semiconductor region of the same conductivity type as a signal charge, and wherein a fixed potential is supplied to the charge draining region.

17 Claims, 16 Drawing Sheets

(56) References Cited

U.S. PATENT DOCUMENTS

| | | | | |
|---|---|---|---|---|
| 2012/0205769 A1* | 8/2012 | Tsai | .................. | H01L 27/14636 |
| | | | | 438/66 |
| 2020/0077055 A1* | 3/2020 | Kim | ....................... | H04N 25/11 |
| 2020/0119072 A1* | 4/2020 | Lim | ......................... | G02B 1/14 |
| 2020/0295068 A1* | 9/2020 | Sato | .................. | H01L 27/14609 |
| 2021/0104571 A1* | 4/2021 | Shohji | ............... | H01L 27/14609 |

FOREIGN PATENT DOCUMENTS

| | | |
|---|---|---|
| JP | 2009-505437 A | 2/2009 |
| JP | 2011097418 A | 5/2011 |
| JP | 2011-151461 A | 8/2011 |
| JP | 2013162336 A | 8/2013 |
| JP | 2018-185749 A | 11/2018 |
| JP | 2020-145397 A | 9/2020 |
| JP | 2021-176154 A | 11/2021 |
| WO | 2012/070164 A1 | 5/2012 |
| WO | 2017/043068 A1 | 3/2017 |

\* cited by examiner

FRONT VIEW

TOP VIEW

REAR VIEW

PHOTOELECTRIC CONVERSION APPARATUS, PHOTOELECTRIC CONVERSION SYSTEM, AND MOVING BODY

BACKGROUND

Field

The present disclosure relates to a photoelectric conversion apparatus, a photoelectric conversion system, and a moving body.

Description of the Related Art

A photoelectric conversion apparatus having an effective pixel region including a plurality of pixels and an optical black (OB) region disposed around the effective pixel region and shielded from light is known. Japanese Patent Application Laid-Open No. 2011-97418 discusses a backside illumination photoelectric conversion apparatus. In the backside illumination photoelectric conversion apparatus, light enters from a surface of a semiconductor substrate opposite to a surface of the semiconductor substrate on the side where a wiring layer is disposed. According to Japanese Patent Application Laid-Open No. 2011-97418, charge draining pixels that drain signal charges leaking from an effective pixel region to an area between the effective pixel region and an OB region or to the OB region are disposed between the effective pixel region and the OB region. The charge draining pixels forcibly drain signal charges leaking from the effective pixel region.

Japanese Patent Application Laid-Open No. 2011-97418 discusses an excess charge mixed in the OB region from the effective pixel region, but does not discuss an excess charge mixed in the OB region from the periphery of the OB region. That is, in a case where OB pixels are placed in an end portion of a substrate as in Japanese Patent Application Laid-Open No. 2011-97418, and if signal charges generated in the periphery of the OB region are mixed in the OB region, black level reference signals fluctuate. Thus, it is also necessary to prevent an excess charge from being mixed in the OB region. Particularly, in the case of a laminated photoelectric conversion apparatus, a signal processing circuit that processes signals output from pixels does not need to be placed in the periphery of an OB region. Thus, the effect of the present invention becomes more remarkable.

SUMMARY

The present invention is directed to providing a photoelectric conversion apparatus that prevents an excess charge from being mixed in an OB region and detects black level reference signals more accurately in a laminated photoelectric conversion apparatus.

According to an aspect of the present invention, a photoelectric conversion apparatus includes a first substrate having a first semiconductor device layer including a plurality of photoelectric conversion units and a well in which the plurality of photoelectric conversion units is disposed, and a second substrate having a second semiconductor device layer including a circuit configured to process signals obtained by the plurality of photoelectric conversion units, wherein the first and second substrates are laminated together, wherein the first semiconductor device layer includes an effective pixel region having the plurality of photoelectric conversion units, an optical black pixel region provided between the effective pixel region and an end of the first semiconductor device layer and having the plurality of photoelectric conversion units, and an outer periphery region disposed between the optical black pixel region and the end of the first semiconductor device layer, wherein in a planar view, a light-blocking region formed by a light-blocking layer overlaps the optical black pixel region, and the light-blocking region does not overlap the outer periphery region, wherein the outer periphery region has a charge draining region including a semiconductor region of the same conductivity type as a signal charge, and wherein a fixed potential is supplied to the charge draining region.

Further features of the present invention will become apparent from the following description of embodiments with reference to the attached drawings.

DESCRIPTION OF THE EMBODIMENTS

Figure 1:
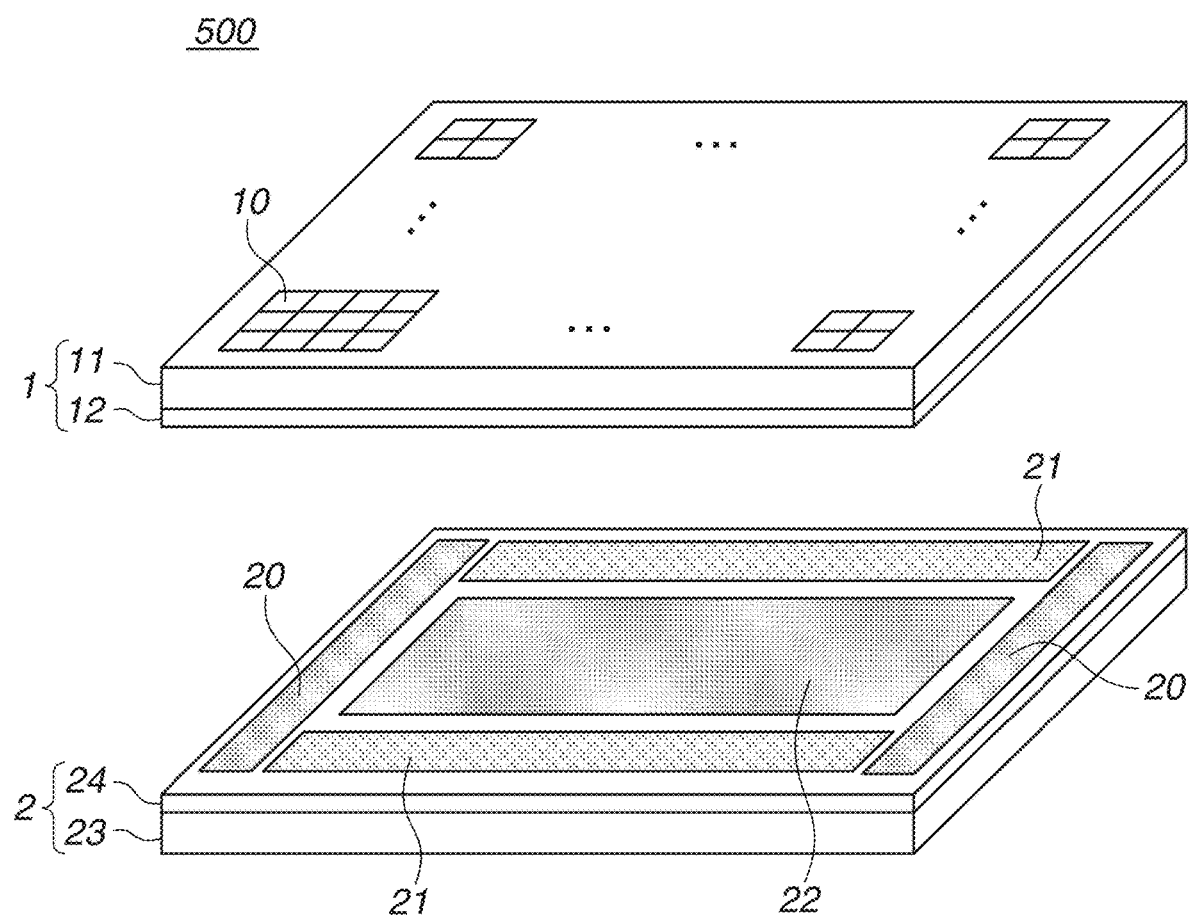
FIG. 1 is a schematic view of semiconductor substrates of a photoelectric conversion apparatus according to a first embodiment.

Embodiments illustrated below merely make the technical idea of the present disclosure specific, and are not meant to limit the present disclosure. The sizes of members and the positional relationships between the members illustrated in the drawings are exaggerated in some cases to clarify the description. In the following description, similar components are designated by the same reference numbers and description thereof is omitted.

In the following description, a semiconductor region of a first conductivity type where carriers of the same conductivity type as a signal charge are majority carriers is an N-type semiconductor region, and a semiconductor region of a second conductivity type is a P-type semiconductor region. In a case where a signal charge is a hole, the present disclosure also holds true. In that case, a semiconductor region of the first conductivity type where carriers of the same conductivity type as the signal charge are majority carriers is a P-type semiconductor region, and a semiconductor region of the second conductivity type is an N-type semiconductor region.

In the specification and the claims, the term "impurity concentration" means a net impurity concentration compensated for by impurities of the opposite conductivity type. That is, an "impurity concentration" refers to a net doping concentration. A region where a P-type added impurity concentration is higher than an N-type added impurity concentration is a P-type semiconductor region. Conversely, a region where an N-type added impurity concentration is higher than a P-type added impurity concentration is an N-type semiconductor region.

In the specification, a "planar view" refers to a view from a direction perpendicular to a light incident surface of a semiconductor substrate. A "cross section" refers to a surface in a direction perpendicular to the light incident surface of the semiconductor substrate. In a case where the light incident surface of the semiconductor substrate is a rough surface when viewed microscopically, a planar view is defined based on the light incident surface of the semiconductor substrate when viewed macroscopically.

In the specification, a depth direction is a direction from the light incident surface (a first surface) of the semiconductor substrate to a surface (a second surface) of the semiconductor substrate on the side where a transistor is disposed.

A first embodiment will be described. FIG. 1 illustrates a photoelectric conversion apparatus 500 according to the first embodiment. The photoelectric conversion apparatus 500 is a semiconductor device integrated circuit (IC). The photoelectric conversion apparatus 500 according to the present embodiment can be used as, for example, an image sensor, a photometric sensor, or a distance measurement sensor.

The photoelectric conversion apparatus 500 is a laminated photoelectric conversion apparatus in which all or parts of substrates 1 and 2 are laminated and joined together. The substrates 1 and 2 may be in the state of a chip obtained by dicing a wafer after the lamination, or may be in the state of a wafer. The photoelectric conversion apparatus 500 is a laminated backside illumination photoelectric conversion apparatus.

The substrate 1 has a semiconductor device layer 11 (a first semiconductor device layer) including a pixel circuit included in a pixel 10, and a wiring structure 12 (a first wiring structure). In the specification, a "semiconductor device layer" includes not only a semiconductor layer but also the gate of a transistor formed in the semiconductor layer. Wiring layers in a wiring structure are not included in the "semiconductor device layer". The substrate 2 has a wiring structure 24 (a second wiring structure) and a semiconductor device layer 23 (a second semiconductor device layer) including an electric circuit. As described below, the wiring structure 12 of the substrate 1 and the wiring structure 24 of the substrate 2 are joined together by metal joint portions formed by joining wiring layers included in the wiring structures 12 and 24. Each metal joint portion is a structure where a metal forming a wiring layer and a metal forming a wiring layer are directly joined together.

Although the details will be described below, elements included in the pixel 10 are disposed in the semiconductor device layer 11. Some of the components of the pixel 10 may be disposed in the semiconductor device layer 11, and the other components of the pixel 10 may be disposed in a semiconductor device layer. In this case, examples of the components of the pixel circuit disposed in the semiconductor device layer 11 among the pixel 10 include photoelectric conversion elements such as photodiodes. The pixel circuit including the photoelectric conversion elements are disposed in a two-dimensional array in the semiconductor device layer 11 in a planar view. The semiconductor device layer 11 includes a pixel region where a plurality of pixel circuits is disposed in a two-dimensional array. In FIG. 1, in the semiconductor device layer 11, a plurality of photoelectric conversion elements included in a plurality of pixel circuits is disposed in a two-dimensional array in a row direction and a column direction.

The wiring structure 12 includes M (M is an integer greater than or equal to 1) wiring layers and interlayer insulating materials. The wiring structure 24 includes N (N is an integer greater than or equal to 1) wiring layers and interlayer insulating materials.

The semiconductor device layer 23 includes an electric circuit that processes signals obtained by the photoelectric conversion units disposed in the semiconductor device layer 11. For convenience of description, in FIG. 1, components illustrated on an upper surface of the substrate 2 are components disposed in the semiconductor device layer 23. For example, the electric circuit is any one of transistors included in row scanning circuits 20, column scanning circuits 21, and a signal processing circuit 22 illustrated in FIG. 1. For example, the signal processing circuit 22 is at least any one of an amplification circuit, a selection circuit, a logical operation circuit, an analog-to-digital (AD) conversion circuit, a memory, and a circuit that performs a compression process and a combining process, and some of the components of the pixel 10, such as an amplification transistor, a selection transistor, and a reset transistor.

The pixel 10 can refer to the minimum unit of circuits repeatedly arranged to form an image. Then, the pixel circuit included in each pixel 10 and disposed in the semiconductor device layer 11 only needs to include at least a photoelectric conversion element. The pixel circuit may include a component other than the photoelectric conversion element. For example, the pixel circuit may further include at least any one of a transfer transistor, floating diffusion (FD), a reset transistor, an amplification transistor, a capacitance-added transistor, and a selection transistor. Typically, a selection transistor and a group of elements connected to a signal line via the selection transistor are included in the pixel 10. That is, the selection transistor can be an outer edge of the pixel circuit. Alternatively, a set of a photoelectric conversion element and a transfer transistor can also be included in the pixel 10. Yet alternatively, a set of one or more photoelectric conversion elements and a single amplification circuit or a single AD conversion circuit may be included in the pixel 10.

Figure 2:
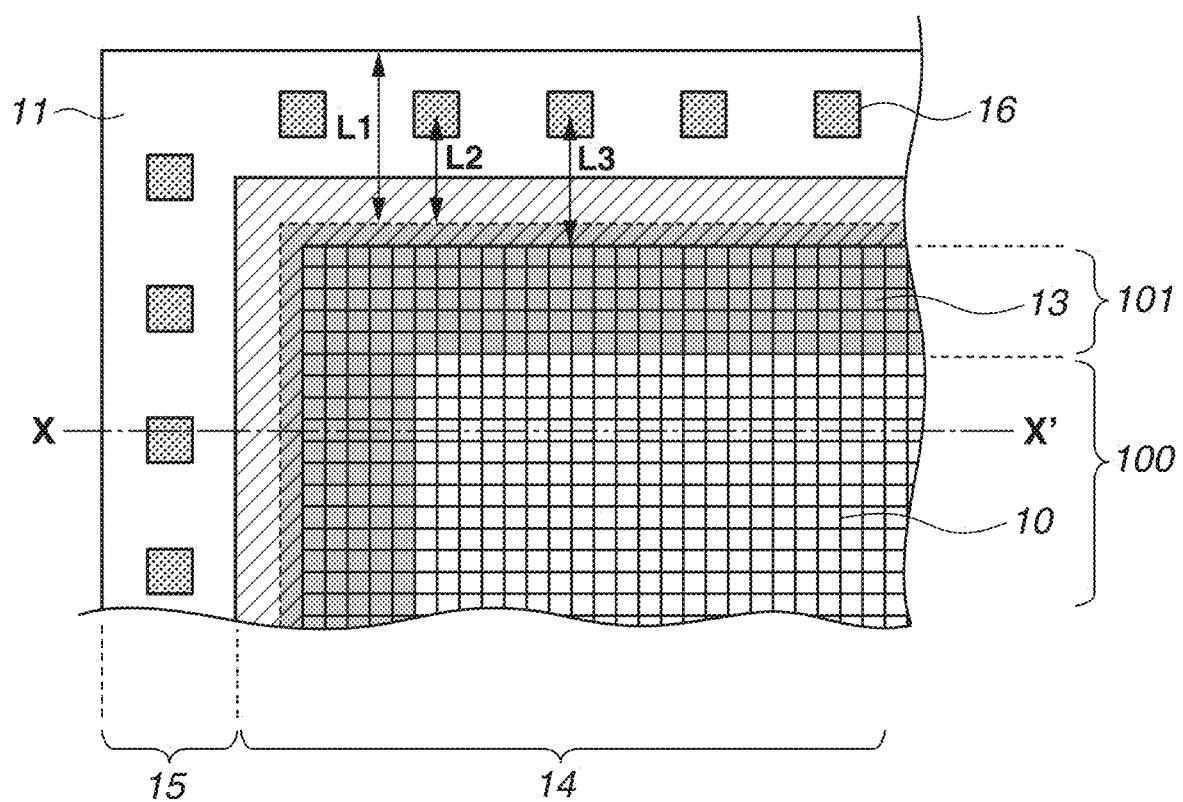
FIG. 2 is a schematic top view of a semiconductor substrate according to the first embodiment.

FIG. 2 illustrates a schematic top view of an end portion of the semiconductor device layer 11 according to the first embodiment. In the pixel region of the semiconductor device layer 11 are provided, an effective pixel region 100 where effective pixels that use signal charges incident on the effective pixels as signals are disposed, and an optical black pixel region 101 where optical black pixels (OB pixels) that detect black level reference values are disposed. In the OB pixel region 101, a light-blocking layer 13, which is placed in the periphery of the effective pixel region 100 in a planar view and which blocks light incident on photoelectric conversion units in the OB pixel region 101, is provided. In other words, a light-blocking region formed by the light-blocking layer 13 overlaps the OB pixel region 101 in a planar view. The "periphery" does not need to be the entire periphery, and only needs to be at least any of portions above and below and to the left and right of the effective pixel region 100. Also in the following description, the "periphery" also includes a portion that is not the entire periphery, unless otherwise stated. "Light-blocking" is not limited to the blocking of 100% of light, and refers to the blocking of 50% or more of light, for example.

Within the semiconductor device layer 11, a well region 14 and an outer periphery region 15 located in the periphery of the well region 14 are disposed. The light-blocking region formed by the light-blocking layer 13 does not overlap the outer periphery region 15 in a planar view. In the present embodiment, the outer periphery region 15 and the light-blocking region do not completely overlap each other in a planar view, but may partially overlap each other as in an embodiment described below. At least some of the pixels 10 are formed in the well region 14. Pad portions 16 are provided in the outer periphery region 15.

The pad portions 16 are disposed between the ends of the semiconductor device layer 11 and the well region 14. The shortest distance L1 between the semiconductor device layer 11 and the light-blocking layer 13 is 100 µm or more and 250 µm or less, for example, in a planar view. It is desirable that the shortest distance L1 should be 100 µm or more and 150 µm or less. The shortest distance L2 between the center of each pad portion 16 and the light-blocking layer 13 is 30 µm or more and 200 µm or less, for example, in a planar view. It is desirable that the shortest distance L2 should be 50 µm or more and 100 µm or less. To avoid a formation failure due to a manufacturing error when the pad portions are formed, it is necessary to keep a predetermined distance or more. Meanwhile, to expand the area of the effective pixel region 100 without expanding the area of the semiconductor device layer 11, it is desirable that the shortest distance L2 should be a predetermined distance or less. The center of the pad portion 16 refers to the center of a trench of the pad. As the details will be described below, the shorter the distance between the center of the pad portion 16 and the OB pixel region 101 is, the more remarkable the effect of the present embodiment is. The shortest distance L3 between the center of the pad portion 16 and the pixels 10 in the OB pixel region 101 is 100 µm or more and 500 µm or less, for example. It is desirable that the shortest distance L3 should be 250 µm or more and 350 µm or less.

Figure 3:
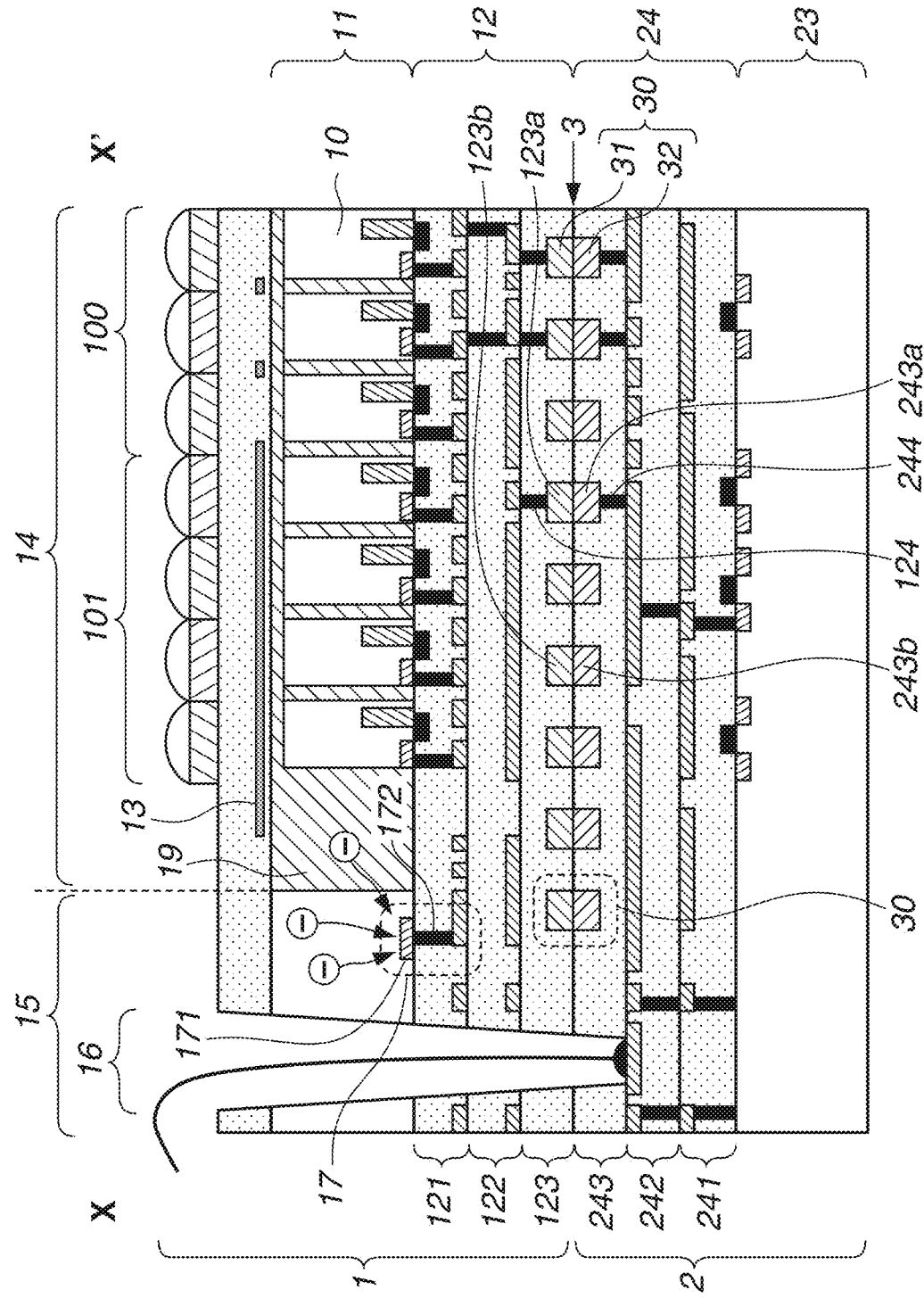
FIG. 3 is a schematic cross-sectional view along X-X' in FIG. 2.

FIG. 3 illustrates a schematic cross-sectional view take along line X-X' in FIG. 2. The substrates 1 and 2 are bonded and laminated together on a joint surface 3. Between the semiconductor device layer 11 of the substrate 1 and the semiconductor device layer 23 of the substrate 2, the wiring structure 12 of the substrate 1 and the wiring structure 24 of the substrate 2 are located. In FIG. 3, the wiring structure 12 includes three wiring layers 121, 122, and 123, and the wiring structure 24 includes three wiring layers 241, 242, and 243.

The wiring structure 12 includes the three wiring layers 121, 122, and 123. The wiring layers 121, 122, and 123 can be, for example, copper (Cu) wiring layers. In FIG. 3, the wiring layer 123 forms metal portions 31 of metal joint portions 30. The metal portions 31 are embedded in recessed portions formed in an interlayer insulating film and each have a Damascene structure.

The wiring structure 24 includes the three wiring layers 241, 242, and 243. The wiring layers 241, 242, and 243 can be Cu wiring layers. In FIG. 3, the wiring layer 243 forms metal portions 32 of the metal joint portions 30. The metal portions 32 are embedded in recessed portions formed in an interlayer insulating film and each have a Damascene structure.

The interlayer insulating film including the recessed portions in which the metal portions 31 are embedded and the interlayer insulating film including the recessed portions in which the metal portions 32 are embedded are joined to (in contact with) each other by the metal portions 31 and 32. The metal joint portions 30 are formed by joining the metal portions 31 and 32.

A via plug 124 formed in the interlayer insulating film of the wiring layer 123 allows conduction between each metal portion 31 and the wiring layer 122. A via plug 244 formed in the interlayer insulating film of the wiring layer 243 allows conduction between each metal portion 32 and the wiring layer 242. The metal joint portion 30 to which the via plugs 124 and 244 are connected electrically connects the semiconductor device layers 11 and 23.

For example, the wiring layer 123 includes a wiring pattern 123a connected to a wiring pattern of an upper wiring layer above the wiring layer 123, and a wiring pattern 123b that is not connected to the wiring pattern of the upper wiring layer above the wiring layer 123. The wiring layer 243 includes a wiring pattern 243a connected to a wiring pattern of a lower wiring layer below the wiring layer 243, and a wiring pattern 243b that is not connected to the wiring pattern of the lower wiring layer below the wiring layer 243. For example, in FIG. 3, the wiring pattern 123a is connected to the wiring pattern of an upper wiring layer above the wiring pattern 123a via the via plug 124. The wiring pattern 243a is connected to the wiring pattern of a lower wiring layer below the wiring pattern 243a via the via plug 244. Via plugs are not essential, and a wiring pattern and a wiring pattern of an upper layer or a lower layer may be connected together in direct contact with each other.

In FIG. 3, the wiring patterns 123a and 243a electrically connect the semiconductor device layers 11 and 23. All the wiring patterns 123a and 243a do not need to connect the semiconductor device layers 11 and 23, and some of the wiring patterns 123a and 243a may be connected to the semiconductor device layer 11 or 23. Alternatively, some of the wiring patterns 123a and 243a may be connected to any of the wiring layers, and may not be connected to either of the semiconductor device layers 11 and 23.

As illustrated in FIG. 3, the semiconductor device layer 11 includes the well region 14 where a well 19 is disposed, and the outer periphery region 15 located between the end of the semiconductor device layer 11 and the well region 14. For example, the well 19 is a region where P-type impurities are doped by ion implantation, and the outer periphery region 15 is a region where the well 19 is not disposed. The outer periphery region 15 is an N-type semiconductor region or a region having a P-type impurity concentration lower than that of the well 19.

Figure 5:
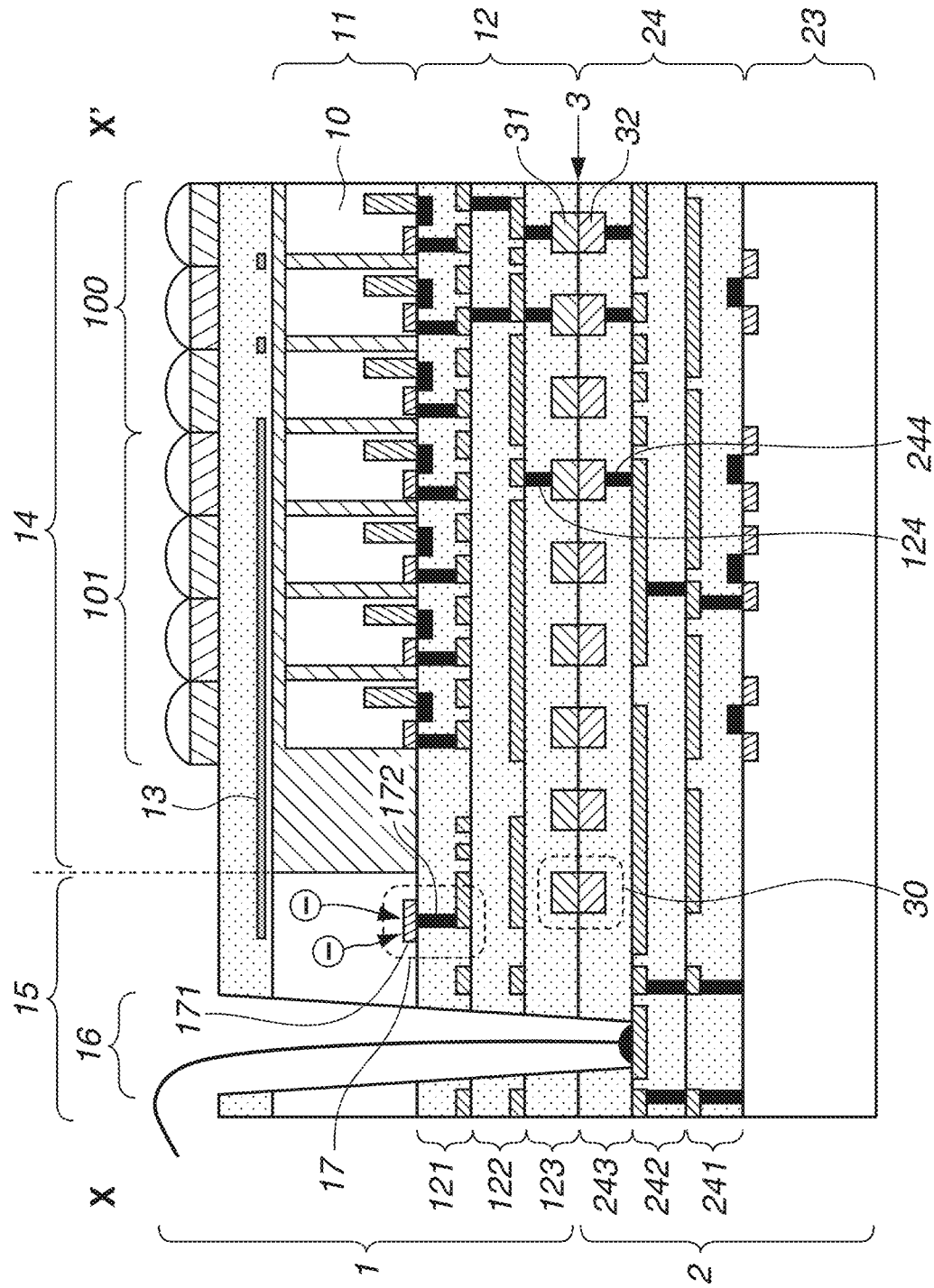
FIG. 5 is a schematic cross-sectional view along X-X' in FIG. 4.

In the well 19, a plurality of photoelectric conversion units of the effective pixel region 100 and a plurality of photoelectric conversion units of the OB pixel region 101 are disposed. In the well region 14, the effective pixel region 100 and the OB pixel region 101 are disposed. In the OB pixel region 101, the light-blocking layer 13 is disposed on the light incident surface side of the semiconductor device layer 11. For example, the light-blocking layer 13 is disposed on the light incident surface of the semiconductor device layer 11 via an insulating material. Microlenses are disposed on the light incident surface side of the semiconductor device layer 11 via an insulating material. In FIG. 5, color filters are disposed between the microlenses and the insulating material. The arrangement of the color filters can be appropriately selected. For example, the arrangement of the color filters may be the Bayer arrangement. Alternatively, a plurality of photoelectric conversion units may be disposed for a single microlens. Although microlenses are also disposed in the OB pixel region 101 in FIG. 3, the microlenses are not essential. A configuration may be employed in which microlenses are not disposed at positions overlapping the light-blocking layer 13 in a planar view. As illustrated in FIG. 3, the light-blocking layer 13 may be disposed between a certain pixel 10 and another pixel 10 adjacent to the certain pixel 10 in a planar view in the effective pixel region 100. This can reduce crosstalk between pixels in the effective pixel region 100.

In the outer periphery region 15, a pad portion 16 is disposed. As illustrated in FIG. 2, a plurality of pad portions 16 is disposed in the outer periphery region 15. The plurality of pad portions 16 conducts electricity between the photoelectric conversion apparatus 500 and a signal processing apparatus disposed outside the photoelectric conversion apparatus 500. The plurality of pad portions 16 includes a pad portion that outputs a signal from the photoelectric conversion apparatus 500 to outside, and a pad portion that inputs a power supply voltage to the photoelectric conversion apparatus 500.

As illustrated in FIG. 3, in an end portion of the semiconductor device layer 11, a trench as the pad portion 16 is formed. The trench is formed in a depth direction from the light incident surface of the semiconductor device layer 11 and formed to a depth reaching a wiring pattern of the wiring layer 242 of the substrate 2. The pad portion 16 is conductive with the wiring layer 242 formed in the substrate 2 by wire bonding.

The wiring layer 242 can be an aluminum (Al) wiring layer. The entire wiring layer 242 does not need to be Al. Only wiring to which the pad portion 16 is connected may be Al wiring, and other wiring may be Cu wiring. Although an example of wire bonding has been illustrated, a through via (a through-silicon via (TSV)) in which a trench is filled with a metal may be employed.

The trench of the pad portion 16 may be formed to a depth reaching the wiring layers of the substrate 1.

As described above, since a trench needs to be formed in the pad portion 16, the light-blocking layer 13 cannot be provided close to the pad portion 16. In the case of a backside illumination photoelectric conversion apparatus, the thickness (the length in the depth direction) of the semiconductor device layer 11 is more likely to be small than in a front-side incidence photoelectric conversion apparatus. For example, the thickness of the semiconductor device layer 11 is 11 µm or less. Thus, it is highly likely that light of a long wavelength, such as infrared light, incident from the light incident surface of the semiconductor device layer 11 is reflected by a surface of the semiconductor device layer 11 on the side where a transistor is formed, and an excess charge is generated. Particularly, as illustrated in FIG. 3, in the configuration of the laminated backside illumination photoelectric conversion apparatus in which peripheral circuits such as scanning circuits and a signal processing circuit are not mounted on the substrate 1, the distance between the end of the substrate 1 and the OB pixel region 101 is small. In other words, in the configuration of the laminated backside illumination photoelectric conversion apparatus, a circuit element is not disposed between the pad portion 16 and the well 19. Thus, if light is incident on a non-light-blocking region such as a part of the well region 14 or the outer periphery region 15, the light can be photoelectrically converted, and a charge can be generated. If an excess charge generated in the non-light-blocking region is mixed in the OB pixel region 101 via the well region 14, the detection of the black level reference values becomes inaccurate, and the pixel values of the effective pixel region 100 cannot be properly corrected.

In the present embodiment, a drain portion 17 that drains an excess charge is provided in the outer periphery region 15. The drain portion 17 functions as a charge draining region that drains an excess charge. A semiconductor region 171 of the same conductivity type as the outer periphery region 15 is disposed in the drain portion 17. The semiconductor region 171 can be formed by doping impurities of the same conductivity type as the outer periphery region 15 by ion implantation. The semiconductor region 171 is a region having an impurity concentration higher than that of the outer periphery region 15. In the semiconductor region 171, a contact plug 172 is formed. A fixed potential is applied to the drain portion 17 via the wiring layer 121 and the contact plug 172. For example, in a case where the outer periphery region 15 is of the N-type and the well region 14 is of the P-type, a power supply voltage having a positive potential is applied. In a case where the outer periphery region 15 is of the P-type and the well region 14 is of the N-type, a power supply voltage having a negative potential is applied. For example, in a case where the outer periphery region 15 is of the P-type, a ground potential is applied. Thus, the drain portion 17 can drain an excess charge. A potential difference is generated between the drain portion 17 and the well region 14, whereby it is possible to prevent a charge from being mixed in the OB pixel region 101. Similarly, it is also possible to prevent a charge generated as a dark current at the end of the substrate 1 from being mixed in the OB pixel region 101. Thus, it is possible to accurately detect the black level reference values.

It is desirable to dispose the semiconductor region 171 and the well 19 as close as possible. For example, it is desirable that the distance between the semiconductor region 171 and the well 19 should be 0 µm or more, preferably 1 µm or more, and 100 µm or less. Consequently, it is easier to prevent an excess charge such as a charge generated by photoelectric conversion near the well 19 or a noise charge (a dark current) in the outer periphery region 15 from being mixed in the OB pixel region 101 through the well 19.

As a wiring pattern of the wiring layer 121 connected to the drain portion 17, a wiring pattern in common with a wiring pattern for supplying power to the drain of a transistor of a pixel may be used. For example, a wiring pattern for supplying VDD power to a reset transistor and a wiring pattern for supplying VDD power to the drain portion 17 may be in common with each other.

In FIG. 2, the pad portions 16 are disposed between an upper end of the semiconductor device layer 11 and the well region 14 and between a left end of the semiconductor device layer 11 and the well region 14 in a planar view. The pad portions 16 may be disposed between a lower end of the semiconductor device layer 11 and the well region 14 and between a right end of the semiconductor device layer 11 and the well region 14 in a planar view. That is, the outer periphery region 15 where the pad portions 16 are disposed may be disposed to surround the entire periphery of the well region 14 of the semiconductor device layer 11 in a planar view. In such a case, the area of a region where the light-blocking layer 13 is not disposed between the OB pixel region 101 and the outer periphery region 15 is likely to be great. Thus, it is possible to remarkably obtain the effect of detecting the black level reference values more accurately. It is not essential that the pad portions 16 are disposed to surround the entire periphery of the well region 14 of the semiconductor device layer 11 in a planar view. Also in a case where the pad portions 16 are not disposed as described above, it is possible to obtain the effect of the present invention so long as the pad portions 16 are disposed in at least a part between the ends of the semiconductor device layer 11 and the well region 14 in a planar view. For example, a form may be employed in which the pad portions 16 are disposed between the upper end of the semiconductor device layer 11 and the well region 14 in a planar view, and the pad portions 16 are not disposed between the left end of the semiconductor device layer 11 and the well region 14. Also in this case, it is possible to obtain the effect of detecting the black level reference values more accurately.

Figure 4:
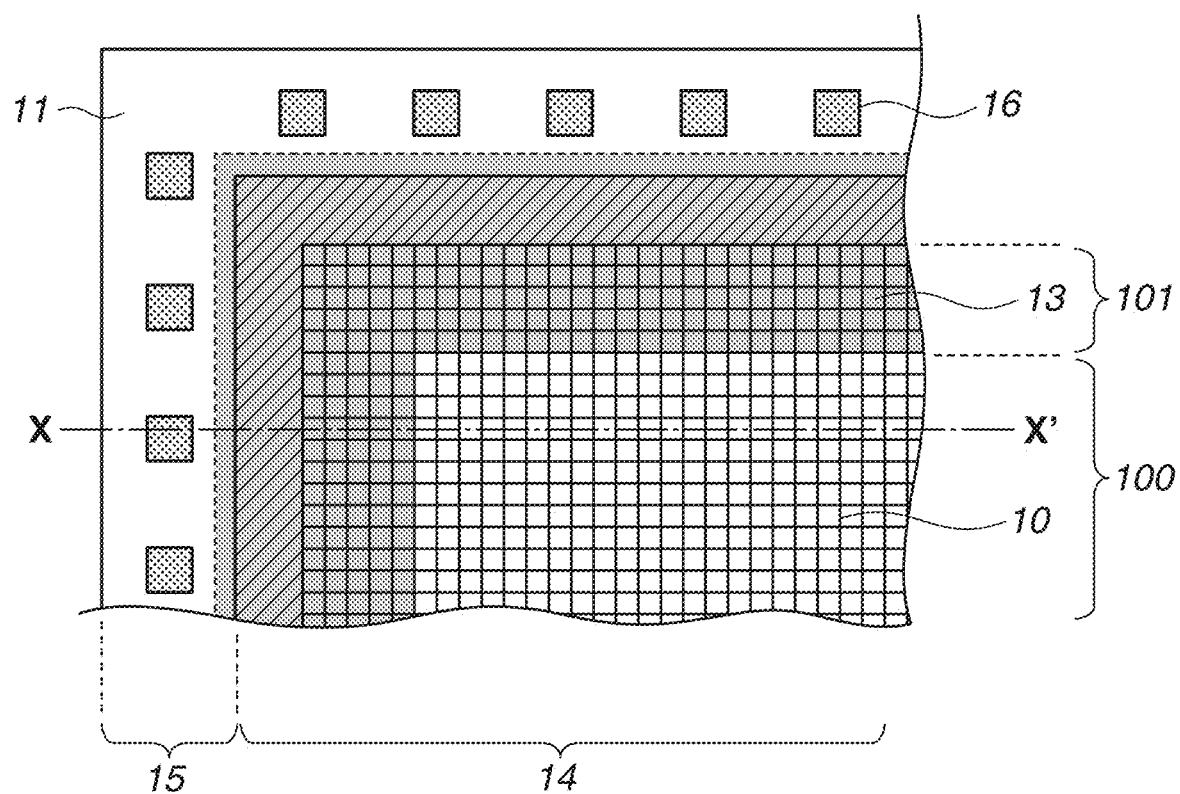
FIG. 4 is a schematic top view of a semiconductor substrate according to a second embodiment.

A second embodiment will be described. FIG. 4 illustrates a schematic top view of an end portion of a semiconductor device layer 11 according to the second embodiment. FIG. 5 illustrates a schematic cross-sectional view taken along a line X-X' in FIG. 4. The present embodiment is different from the first embodiment in that the light-blocking layer 13 is placed to cover the well region 14. Features except for this difference and points described below are substantially the same as those of the first embodiment, and therefore are not described.

As illustrated in FIG. 5, in the present embodiment, the light-blocking layer 13 is disposed to partially overlap the outer periphery region 15 in a planar view. That is, the light-blocking layer 13 protrudes from the end of the well region 14 to the pad portion 16 side in a cross section view.

In the first embodiment, a part of the well region 14 is not shielded from light, and therefore, there is a possibility that an excess charge generated by photoelectric conversion in the well region 14 is mixed in the OB pixel region 101 near the excess charge. On the other hand, in the second embodiment, the well region 14 is shielded from light, and therefore, light is not photoelectrically converted in the well region 14. In other words, the well 19 is not exposed from a light-blocking region in a planar view. That is, in a planar view, the end of the well 19 and the end of the light-blocking layer 13 are at the same position, or the end of the light-blocking layer 13 protrudes further to the semiconductor device layer 11 side than the end of the well 19. In such a case, an excess charge is generated only in the outer periphery region 15 at the end portion of the semiconductor device layer 11, which is a non-light-blocking region. Since the drain portion 17 is provided in the outer periphery region 15 and drains an excess charge, it is possible to prevent a charge from being mixed in the OB pixel region 101 more than in the first embodiment. Thus, it is possible to detect the black level reference values more accurately.

Figure 6:
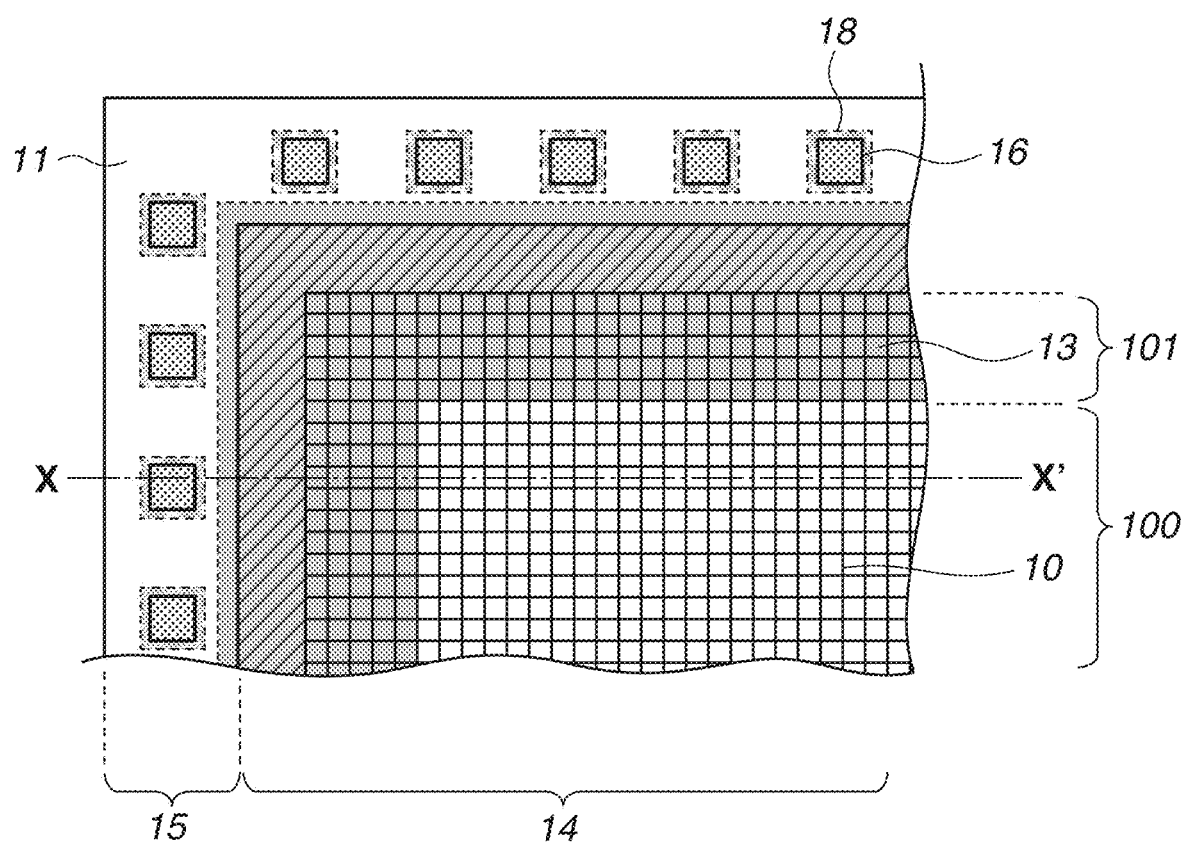
FIG. 6 is a schematic top view of a semiconductor substrate according to a third embodiment.
Figure 7:
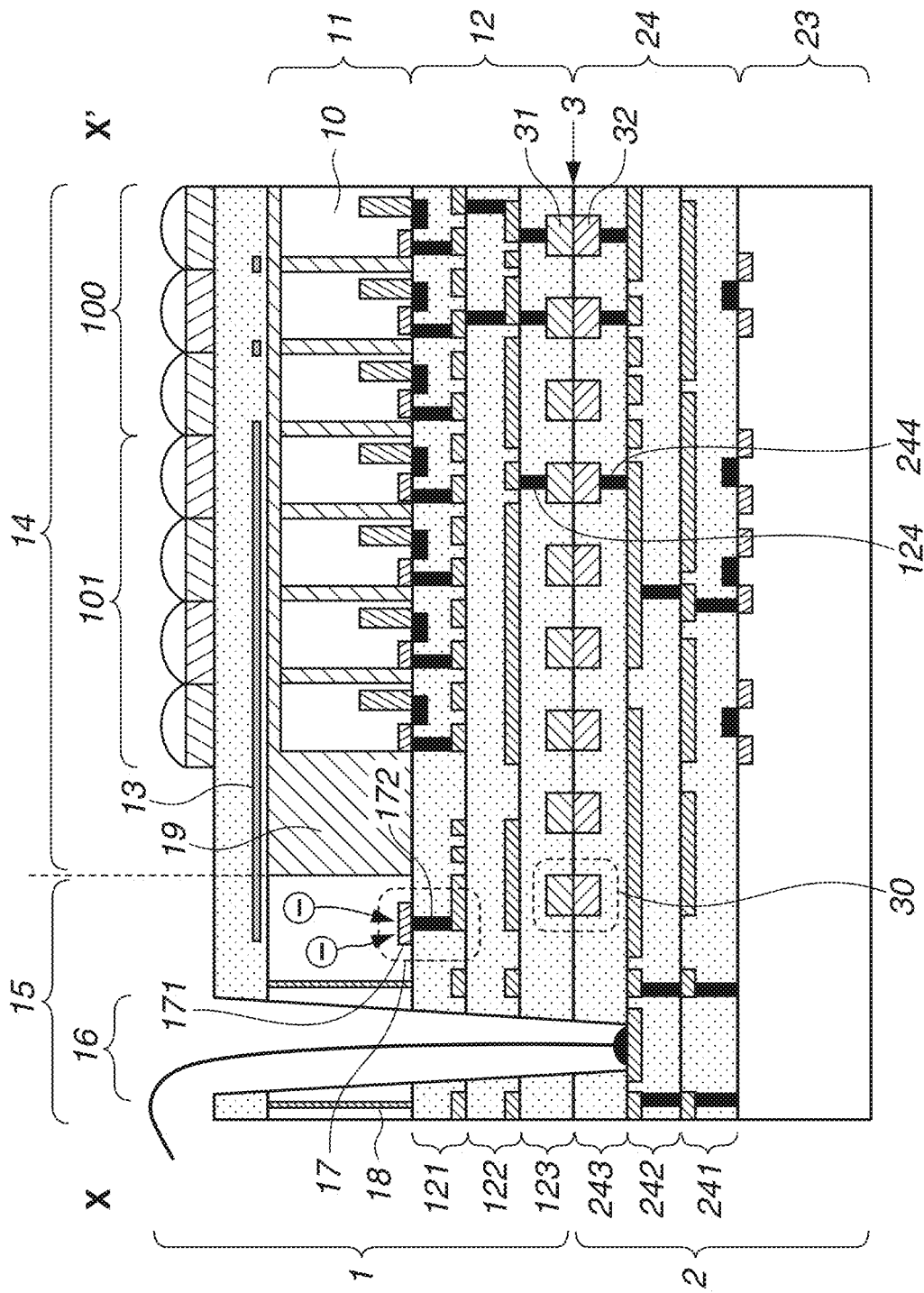
FIG. 7 is a schematic cross-sectional view along X-X' in FIG. 6.

A third embodiment will be described. FIG. 6 illustrates a schematic top view of an end portion of a semiconductor device layer 11 according to the third embodiment. FIG. 7 illustrates a schematic cross-sectional view taken along a line X-X' in FIG. 6. The present embodiment is different from the second embodiment in that separation regions 18 are placed around the pad portions 16 of the semiconductor device layer 11. Features except for this difference and items described below are substantially the same as those of the second embodiment, and therefore will not be described.

A separation region 18 is disposed to surround the entire periphery of each pad portion 16 in a planar view. The separation region 18 is an isolation obtained by embedding an insulating film such as a silicon dioxide film or a silicon nitride film in a trench formed in the semiconductor device layer 11.

In the second embodiment, if wire bonding comes into contact with a side surface of the trench of the pad portion 16 of the semiconductor device layer 11 in which the pad portion 16 is formed, the wire bonding short-circuits with the outer periphery region 15 to which a voltage is applied. On the other hand, in the third embodiment, the separation region 18 separates the outer periphery region 15 near the trench of the pad portion 16 and near the well 19. That is, the side surface of the trench of the semiconductor device layer 11 in which the pad portion 16 is formed is insulated by the separation region 18 from the outer periphery region 15 where the drain portion 17 is disposed and to which a voltage is applied. Thus, it is possible to prevent short-circuiting between the wire bonding and the outer periphery region 15 while detecting the black level reference values more accurately, similarly to the second embodiment.

Figure 8:
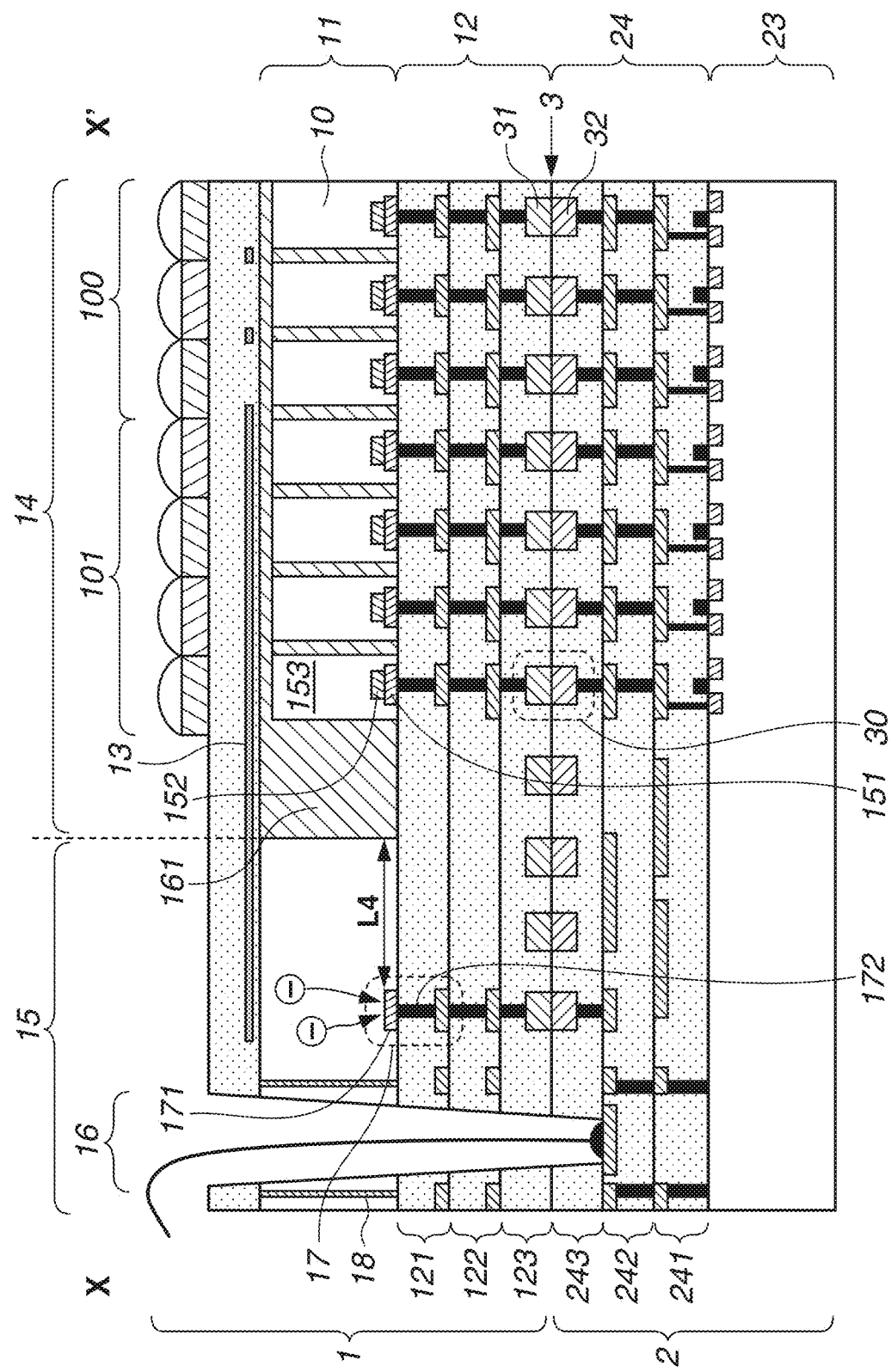
FIG. 8 is a schematic cross-sectional view of a photoelectric conversion apparatus according to a fourth embodiment.

A fourth embodiment will be described. FIG. 8 illustrates a schematic cross-sectional view of a laminated backside illumination photoelectric conversion apparatus according to the fourth embodiment. The present embodiment is different from the third embodiment in that the semiconductor device layer 11 includes avalanche photodiodes (hereinafter, "APDs"). The present embodiment is also different from the third embodiment in that a distance L4 between a semiconductor region 161 of the second conductivity type to which an APD driving voltage is applied and a semiconductor region 171 that drains an excess charge is greater than the distance between the well 19 and the semiconductor region 171 in the third embodiment. Features except for these differences and points described below are substantially the same as those of the third embodiment, and therefore will not be described.

APDs placed in the substrate 1 each include a semiconductor region 151 of the first conductivity type and a semiconductor region 152 of the second conductivity type. An avalanche-multiplied charge is sent to the substrate 2 via a metal joint portion 30. In the substrate 2, a quench circuit and a counter circuit are disposed, and a signal is sent to the counter circuit in the substrate 2 via the metal joint portion 30. Thus, a metal joint portion 30 connecting the semiconductor device layers 11 and 23 is disposed for each APD.

To drive the APD, it is necessary to apply a high voltage to the semiconductor region 152 of the second conductivity type. The difference between a voltage applied to the semiconductor region 151 and a voltage applied to the semiconductor region 152 is 20 V or more, for example. As an example of the voltage applied to the semiconductor region 152, a negative voltage having an absolute value greater than −20 V is employed. The voltage applied to the semiconductor region 152 is supplied from the semiconductor region 161 of the second conductivity type via a semiconductor region 153 of the second conductivity type. Thus, the above high voltage is applied to the semiconductor region 161 of the second conductivity type.

On the other hand, the semiconductor region 171 for draining an excess charge is formed as that of the first conductivity type. Thus, if the semiconductor region 171 is near the semiconductor region 161 of the second conductivity type, an avalanche multiplication region is formed between the semiconductor regions 161 and 171. That is, there is a possibility that an avalanche multiplication region is formed in a region other than the pixel region, and an excess charge is avalanche-multiplied and incident on the OB pixel region 101.

Thus, in a case where a photoelectric conversion unit placed in the substrate 1 is an APD, it is necessary to set the distance L4 between the semiconductor region 161 of the second conductivity type surrounding the pixel region and the semiconductor region 171 of the first conductivity type to a distance at which avalanche multiplication does not occur.

According to the present embodiment, since the distance L4 is great, it is possible to accurately detect the black level reference values while preventing an avalanche multiplication region from being formed between the semiconductor regions 161 and 171.

The distance L4 can be 1 µm or more and 10 µm or less, for example. It is desirable that the distance L4 should be 3 µm or more and 6 µm or less.

As illustrated in FIG. 8, the semiconductor region 171 and the light-blocking layer 13 may overlap each other in a planar view.

Figure 9:
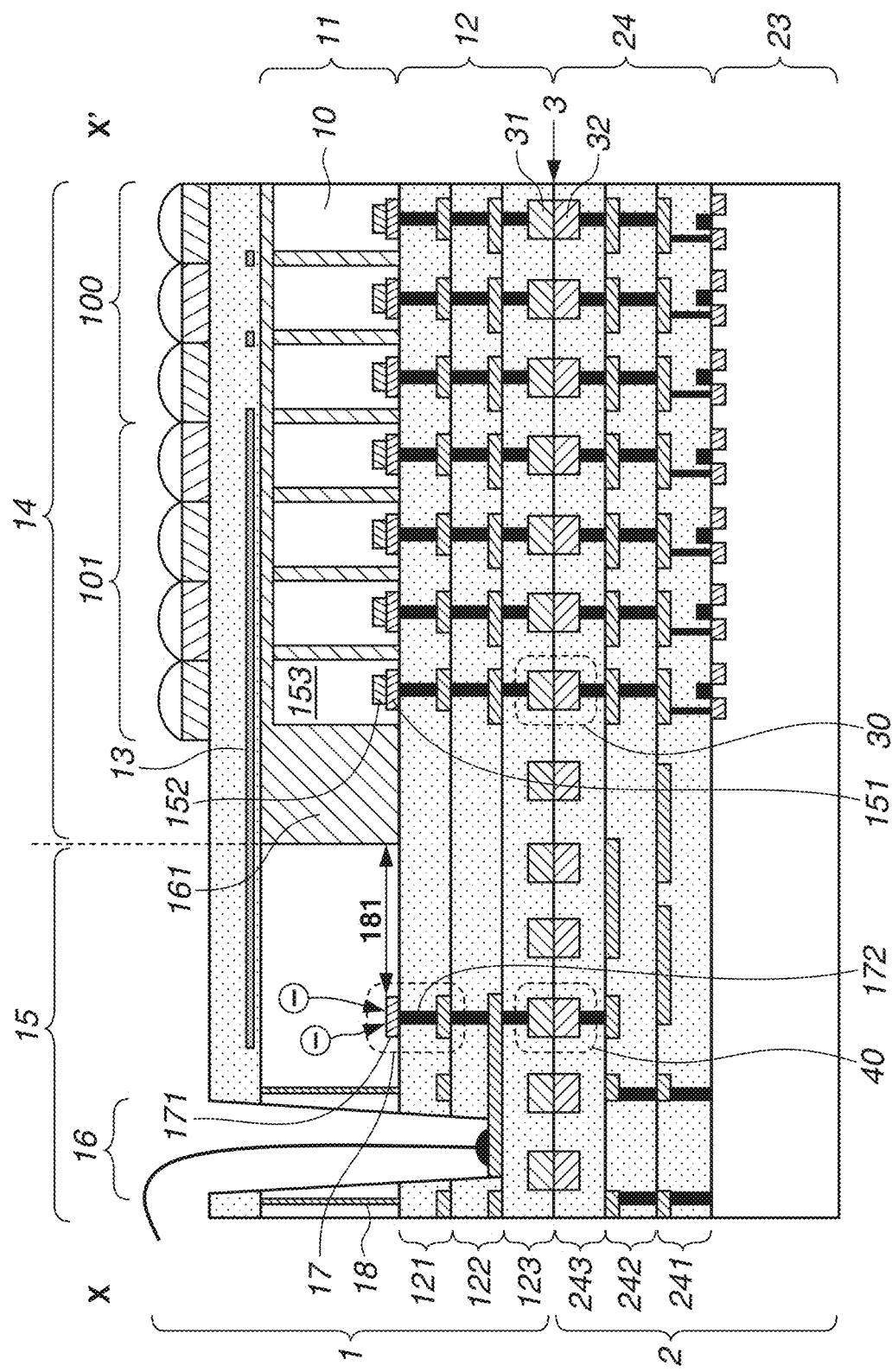
FIG. 9 is a schematic cross-sectional view of a photoelectric conversion apparatus according to a fifth embodiment.

A fifth embodiment will be described. FIG. 9 illustrates a schematic cross-sectional view of a laminated backside illumination photoelectric conversion apparatus according to the fifth embodiment. The present embodiment is different from the fourth embodiment in that the drain portion 17 is connected to the pad portion 16 within the same substrate. Features except for this difference and points described below are substantially the same as those of the fourth embodiment, and therefore will not be described.

In the present embodiment, the trench of the pad portion 16 is formed to a depth reaching a wiring pattern of the wiring layer 122 of the substrate 1, and the wiring pattern of the wiring layer 122 is connected to a bonding wire. Then, the wiring pattern to which the bonding wire is connected and the drain portion 17 are connected together via a contact plug 172 and the wiring pattern of the wiring layer 121.

As described in the fourth embodiment, in a case where a photoelectric conversion unit placed in the substrate 1 is an APD, a high voltage is required to drive the APD. Meanwhile, generally, the substrate 2 is formed by a microfabrication process, and therefore, it is not desirable to apply a high voltage for driving the APD to the semiconductor device layer 23 of the substrate 2 in terms of pressure resistance. Thus, it is desirable to supply a high voltage for driving the APD from the pad placed in the substrate 1. In this case, an excess charge drained from the drain portion 17 of the substrate 1 is drained to outside the photoelectric conversion apparatus via the pad portion 16 placed in the substrate 1.

In a case where the depth of a trench of a pad portion 16 that supplies a voltage for driving an element disposed in the substrate 2 and the depth of a trench of a pad portion 16 that supplies a voltage for driving an APD disposed in the substrate 1 are different from each other, processes may become complicated, and the difficulty of the process may increase.

Thus, in the present embodiment, it is desirable to apply also a voltage for driving an element placed in the substrate 2 to a pad formed in the substrate 1 and then supply the voltage to the semiconductor device layer 23 of the substrate 2 via a metal joint portion 40.

According to the present embodiment, it is possible to accurately detect the black level reference values while preventing an avalanche multiplication region from being formed between the semiconductor regions 161 and 171, similarly to the fourth embodiment. Further, a high voltage is not applied to the semiconductor device layer 23 of the substrate 2, and therefore, it is easier to secure the reliability of a photoelectric conversion apparatus in a case where an APD is used.

Figure 10:
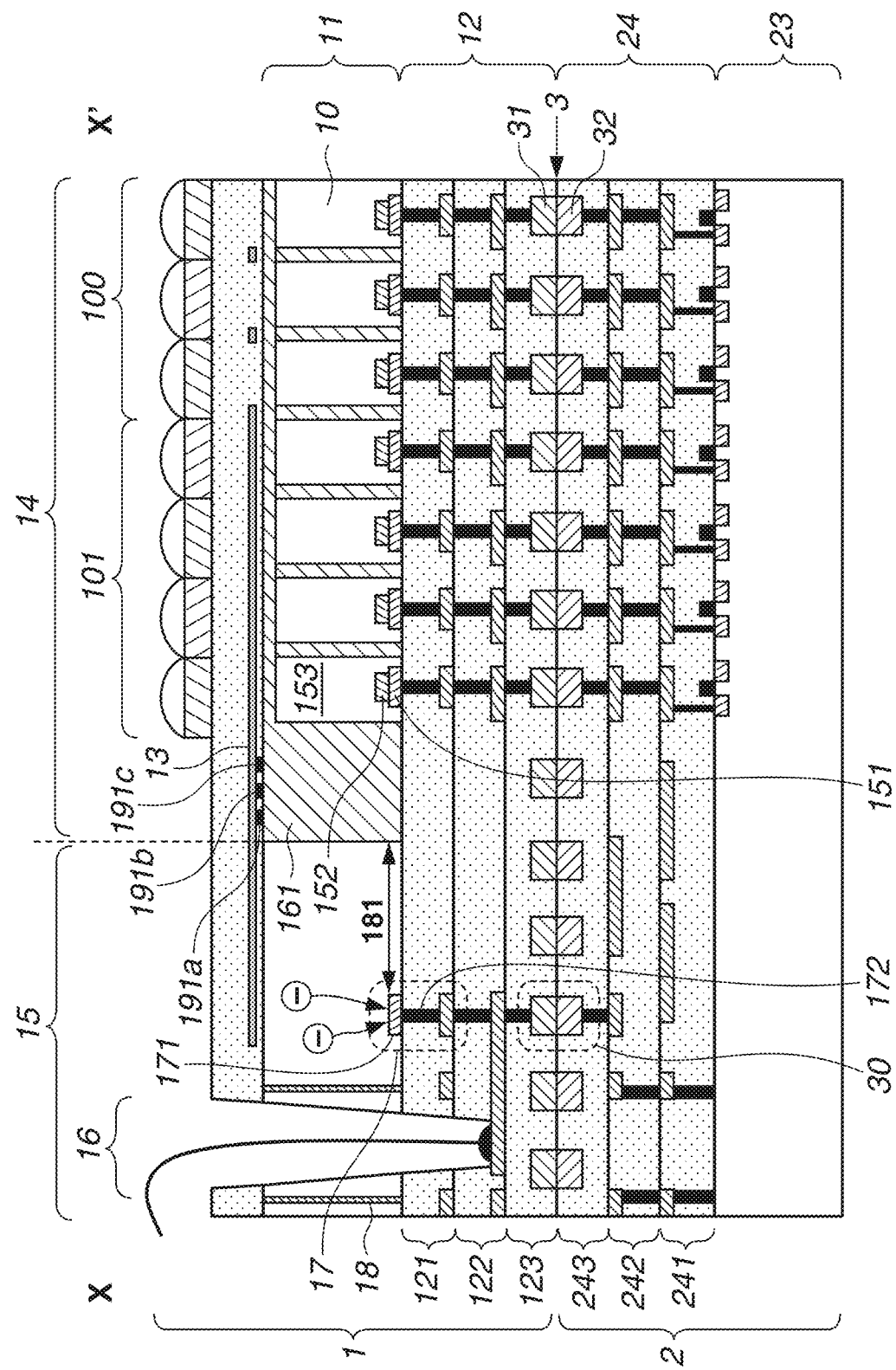
FIG. 10 is a schematic cross-sectional view of a photoelectric conversion apparatus according to a sixth embodiment.
Figure 11:
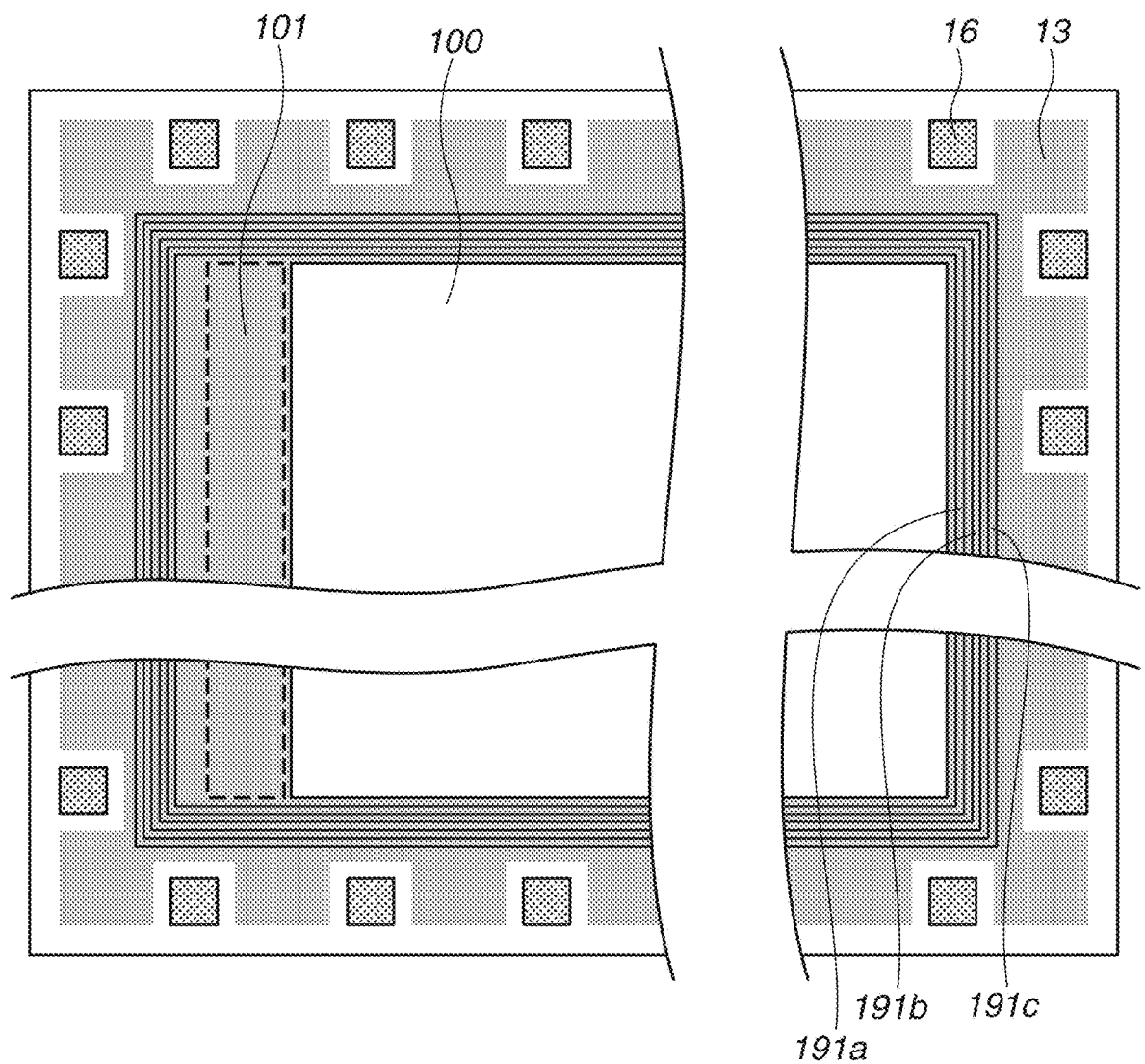
FIG. 11 is a schematic plan view of a light-blocking layer of the photoelectric conversion apparatus according to the sixth embodiment.

A sixth embodiment will be described. FIG. 10 illustrates a schematic cross-sectional view of a laminated backside illumination photoelectric conversion apparatus according to the sixth embodiment. FIG. 11 illustrates a schematic plan view of a light-blocking layer from the light incident surface side of the photoelectric conversion apparatus according to the sixth embodiment. To facilitate the understanding of the positions of via plugs in a planar view, FIG. 11 also illustrates the positions of the via plugs. The present embodiment is different from the fifth embodiment in that the semiconductor region 161 of the second conductivity type and the light-blocking layer 13 are connected together via plugs 191a, 191b, and 191c. The present embodiment is also different from the fifth embodiment in that color filters of different colors are disposed. Features except for these differences are substantially the same as those of the fifth embodiment, and therefore will not be described.

As illustrated in FIG. 10, the light-blocking layer 13 and the semiconductor region 161 of the second conductivity type are conductive with via plugs 191a, 191b, and 191c. As described in the fourth embodiment, a high voltage that is a negative voltage having an absolute value greater than −20 V is applied to the semiconductor region 161 of the second conductivity type. This voltage is also applied to the light-blocking layer 13 via the via plugs 191a, 191b, and 191c. That is, the light-blocking layer 13 and the semiconductor region 161 have the same potential. If the potential difference between the semiconductor region 161 and the light-blocking layer 13 is great, there is a possibility that dielectric breakdown occurs in an insulating film disposed between the light-blocking layer 13 and the semiconductor region 161. According to the present embodiment, however, it is possible to prevent dielectric breakdown in the insulating film.

In FIG. 10, the light-blocking layer 13 and the semiconductor region 161 are connected together via three via plugs, but may be connected together via one or two via plugs, or may be connected together via four or more via plugs.

As illustrated in FIG. 10, it is desirable to dispose the semiconductor region 161 so that the semiconductor region 161 has a width greater than the pixel region including the OB pixel region 101. That is, it is desirable to place the semiconductor region 161 so that the width of the semiconductor region 161 is greater than the width of the pixel region in a cross section view. Consequently, it is easier to connect the light-blocking layer 13 and the semiconductor region 161 via via plugs. Although FIG. 10 illustrates only a single cross section, it is desirable to place the semiconductor region 161 so that the width of the semiconductor region 161 is greater than the width of the pixel region 100 also in a cross section in a direction intersecting the cross section in FIG. 10.

The semiconductor regions 152 of the second conductivity type forming avalanche multiplication regions for APDs may be placed on the entire surface of the pixel region in a planar view. In this case, end portions of the semiconductor regions 152 of the second conductivity type may be included in the semiconductor region 161 of the second conductivity type, or may be in contact with an outer periphery portion of the semiconductor region 161 of the second conductivity type.

In FIG. 11, the light-blocking layer 13 is placed to partially surround the opening of each pad portion 16 in a planar view. For example, in a case where the opening is a rectangle, the light-blocking layer 13 is placed to surround three of the four sides forming the rectangle in a planar view. As described above, it is desirable to place the light-blocking layer 13 as close to the ends of the semiconductor device layer 11 as possible.

As illustrated in FIG. 11, the via plugs 191*a*, 191*b*, and 191*c* are placed to surround the effective pixel region 100 and the OB pixel region 101 in a planar view. The via plugs 191*a* and 191*b* and the semiconductor region 161 are connected together also in a cross section in a direction intersecting the cross section in FIG. 10. As described above, via plugs are placed to surround the entire periphery of the effective pixel region 100 and the OB pixel region 101, whereby it is possible to prevent dielectric breakdown in an insulating film between the light-blocking layer 13 and the semiconductor region 161, regardless of the position of the light-blocking layer 13.

Figure 12:
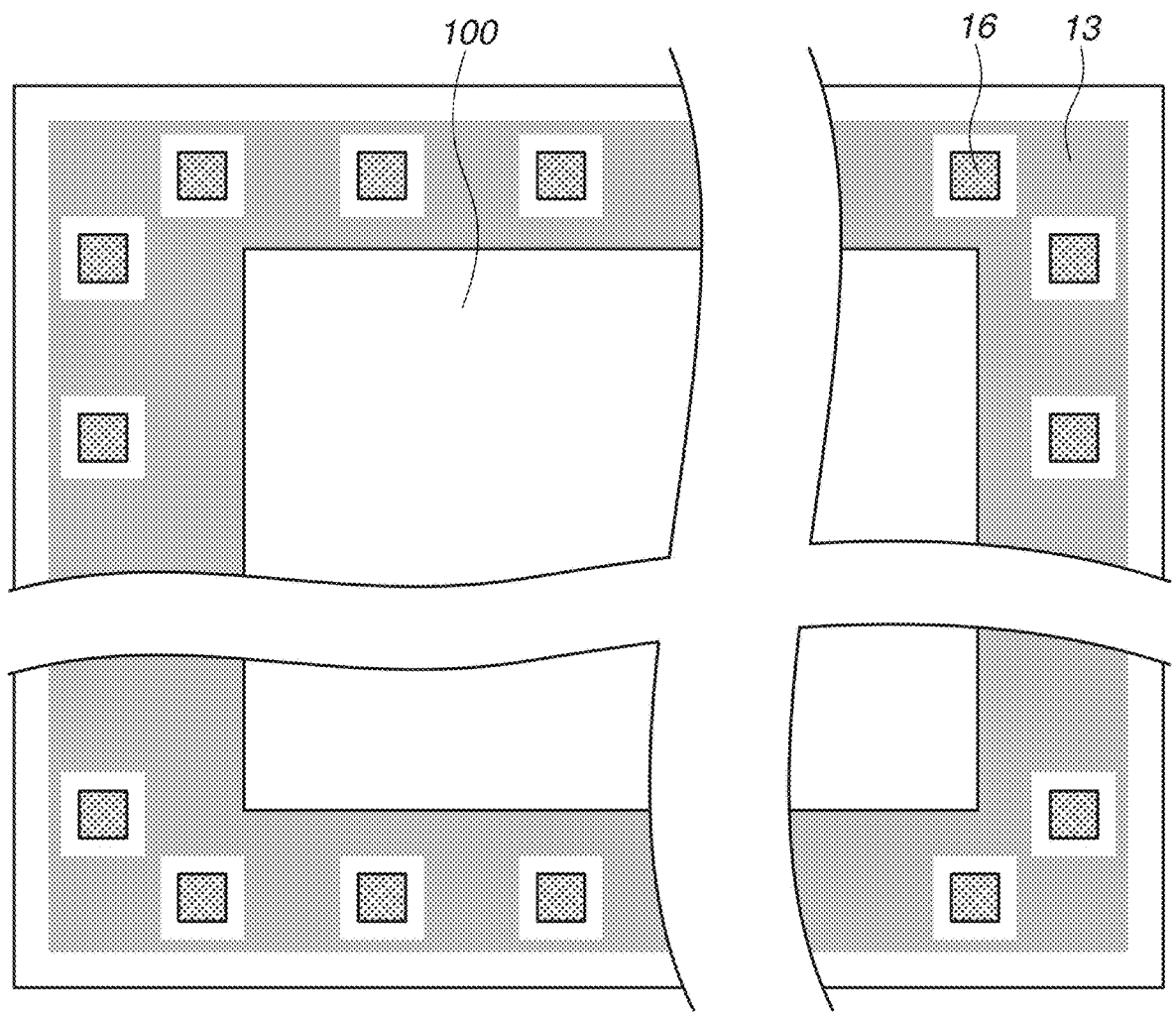
FIG. 12 is a schematic plan view of another example of the light-blocking layer of the photoelectric conversion apparatus according to the sixth embodiment.

Alternatively, as illustrated in FIG. 12, the light-blocking layer 13 may be disposed to surround the entire periphery of each pad portion 16 in a planar view. Consequently, it is possible to reduce the entry of light into the semiconductor device layer 11 compared with the example illustrated in FIG. 11.

Although FIG. 12 does not illustrate the via plugs 191*a*, 191*b*, and 191*c* illustrated in FIG. 11, the via plugs 191*a*, 191*b*, and 191*c* may be disposed. Further, the OB pixel region 101 illustrated in FIG. 11 may be disposed.

According to the present embodiment, it is possible to accurately detect the black level reference values while preventing an avalanche multiplication region from being formed between the semiconductor regions 161 and 171, similarly to the fifth embodiment. Further, a high voltage is not applied to the semiconductor device layer 23 of the substrate 2, and therefore, it is easier to secure the reliability of a photoelectric conversion apparatus in a case where an APD is used. Further, it is possible to prevent dielectric breakdown in an insulating film disposed between the light-blocking layer 13 and the semiconductor region 161.

Figure 13:
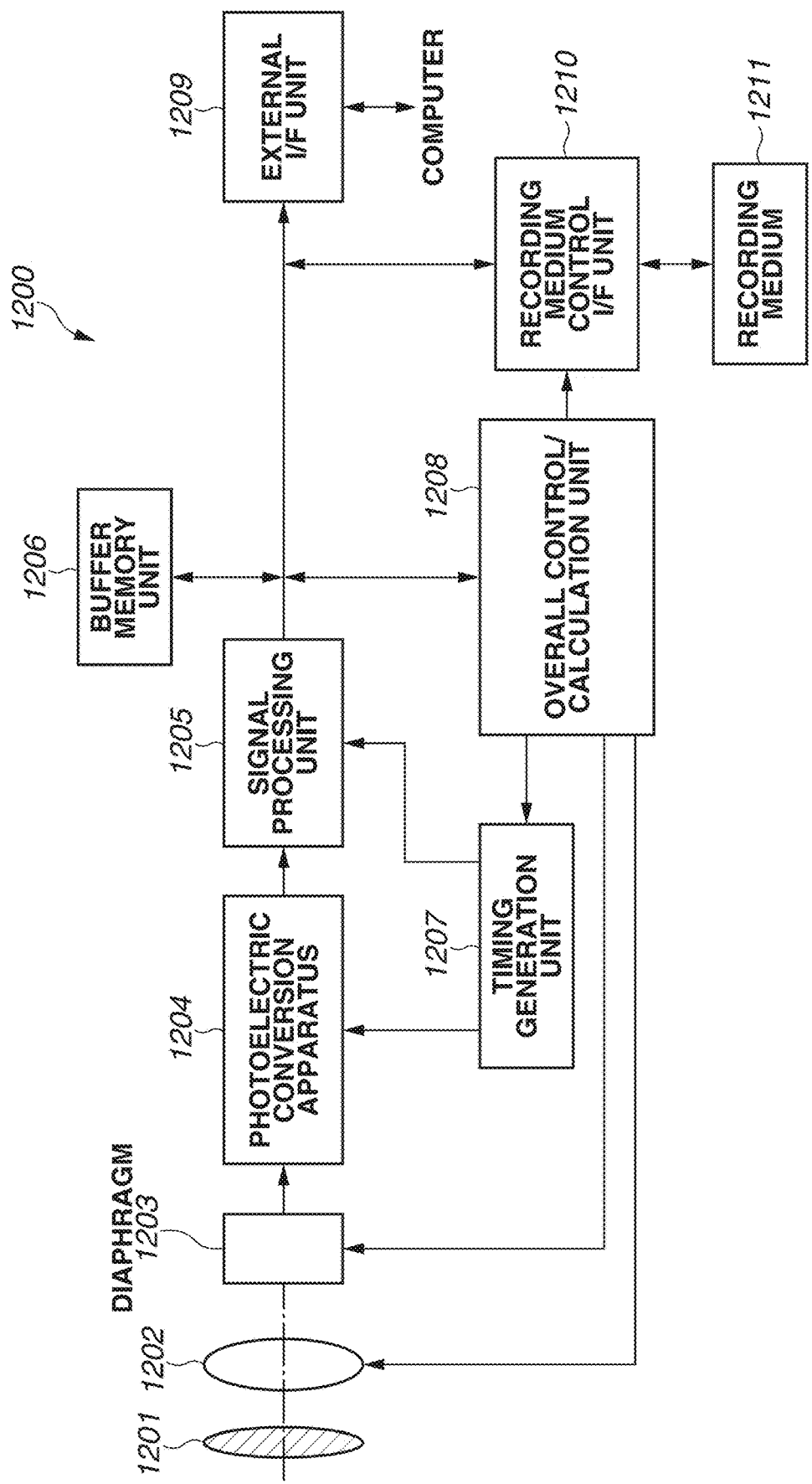
FIG. 13 is a block diagram illustrating a photoelectric conversion system according to a seventh embodiment.

A seventh embodiment will be described. FIG. 13 is a block diagram illustrating the configuration of a photoelectric conversion system 1200 according to the present embodiment. The photoelectric conversion system 1200 according to the present embodiment includes a photoelectric conversion apparatus 1204. Any of the photoelectric conversion apparatuses described in the above embodiments can be applied to the photoelectric conversion apparatus 1204. The photoelectric conversion system 1200 can be used as, for example, an imaging system. Specific examples of the imaging system include a digital still camera, a digital camcorder, and a monitoring camera. FIG. 13 illustrates a digital still camera as an example of the photoelectric conversion system 1200.

The photoelectric conversion system 1200 illustrated in FIG. 13 includes the photoelectric conversion apparatus 1204, a lens 1202 that forms an optical image of an object on the photoelectric conversion apparatus 1204, a diaphragm 1203 that makes the amount of light passing through the lens 1202 variable, and a barrier 1201 that protects the lens 1202. The lens 1202 and the diaphragm 1203 are an optical system for collecting light on the photoelectric conversion apparatus 1204.

The photoelectric conversion system 1200 includes a signal processing unit 1205 that processes an output signal output from the photoelectric conversion apparatus 1204.

The signal processing unit 1205 performs a signal processing operation for performing various types of correction and compression on an input signal where necessary and outputting the resulting signal. Further, the photoelectric conversion system 1200 includes a buffer memory unit 1206 that temporarily stores image data, and an external interface unit (external I/F unit) 1209 that is used to communicate with an external computer. Further, the photoelectric conversion system 1200 includes a recording medium 1211 such as a semiconductor memory in or from which captured data is recorded or read, and a recording medium control interface unit (recording medium control I/F unit) 1210 that is used to record or read captured data in or from the recording medium 1211. The recording medium 1211 may be built into the photoelectric conversion system 1200, or may be attachable to and detachable from the photoelectric conversion system 1200. The photoelectric conversion system 1200 may wirelessly communicate with the recording medium 1211 via the recording medium control I/F unit 1210, or may wirelessly communicate via the external I/F unit 1209.

Further, the photoelectric conversion system 1200 includes an overall control/calculation unit 1208 that performs various calculations and also controls the entire digital still camera, and a timing generation unit 1207 that outputs various timing signals to the photoelectric conversion apparatus 1204 and the signal processing unit 1205. The timing signals may be input from outside, and the photoelectric conversion system 1200 only needs to include at least the photoelectric conversion apparatus 1204 and the signal processing unit 1205 that processes an output signal output from the photoelectric conversion apparatus 1204. As described in the fourth embodiment, the timing generation unit 1207 may be provided in the photoelectric conversion apparatus 1204. The overall control/calculation unit 1208 and the timing generation unit 1207 may be configured to perform a part or all of the control function of the photoelectric conversion apparatus 1204.

The photoelectric conversion apparatus 1204 outputs an image signal to the signal processing unit 1205. The signal processing unit 1205 performs predetermined signal processing on the image signal output from the photoelectric conversion apparatus 1204 and outputs image data. The signal processing unit 1205 generates an image using the image signal. The signal processing unit 1205 may perform a distance measurement calculation on a signal output from the photoelectric conversion apparatus 1204. The signal processing unit 1205 and the timing generation unit 1207 may be provided in the photoelectric conversion apparatus 1204. That is, the signal processing unit 1205 and the timing generation unit 1207 may be provided on a substrate on which pixels are disposed. Alternatively, a configuration may be employed in which the signal processing unit 1205 and the timing generation unit 1207 are provided on another substrate. An imaging system is configured using each of the photoelectric conversion apparatuses according to the above embodiments, whereby it is possible to implement an imaging system capable of acquiring an image with better quality.

Figure 14A:
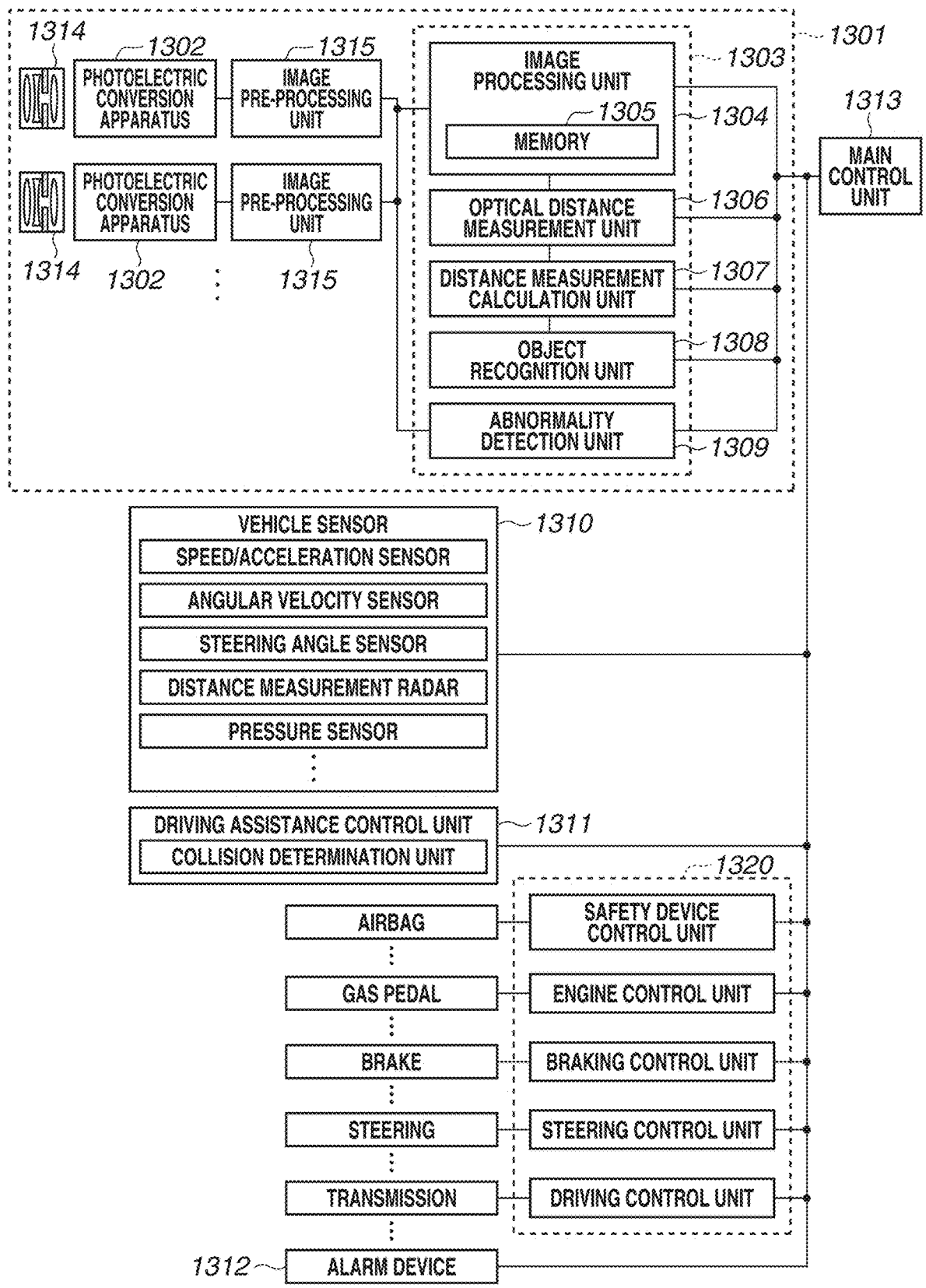
FIGS. 14A and 14B are block diagrams illustrating a photoelectric conversion system according to an eighth embodiment.
Figure 14B:
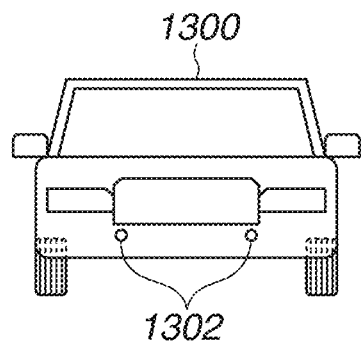
Figure 14B:
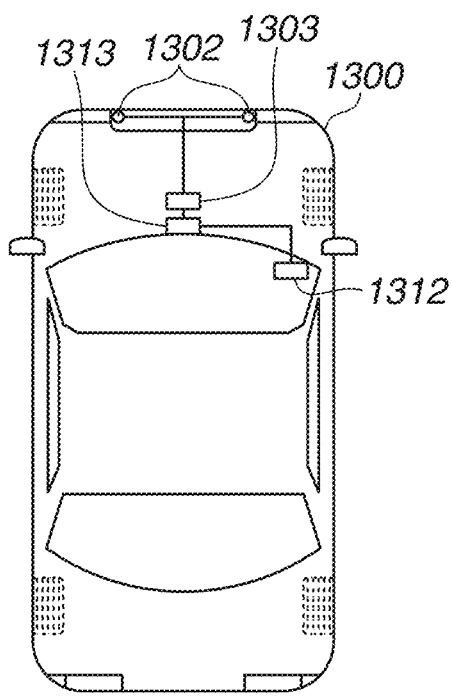
Figure 14B:
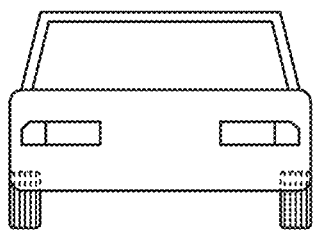
Figure 15:
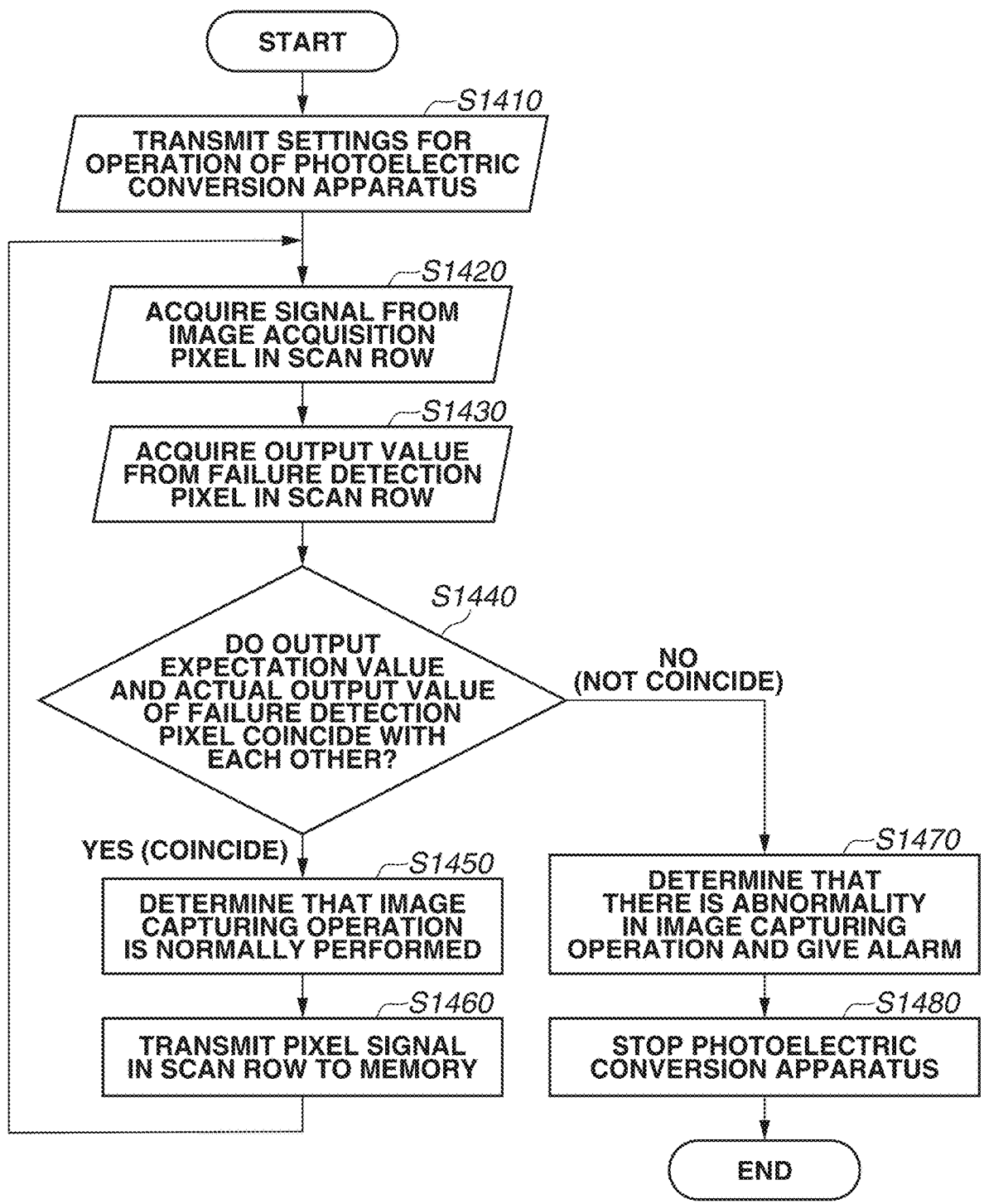
FIG. 15 is a flowchart of the photoelectric conversion system according to the eighth embodiment.

An eighth embodiment will be described. With reference to FIGS. 14A, 14B, and 15, a photoelectric conversion system and a moving body according to the present embodiment will be described. FIGS. 14A and 14B are schematic diagrams illustrating examples of the configurations of the photoelectric conversion system and the moving body according to the present embodiment. FIG. 15 is a flowchart illustrating the operation of the photoelectric conversion system according to the present embodiment. In the present embodiment, an in-vehicle camera is illustrated as an example of the photoelectric conversion system.

FIGS. 14A and 14B illustrate examples of a vehicle system and a photoelectric conversion system for capturing an image that is mounted on the vehicle system. A photoelectric conversion system 1301 includes a photoelectric conversion apparatus 1302, an image pre-processing unit 1315, an integrated circuit 1303, and an optical system 1314. The optical system 1314 forms an optical image of an object on the photoelectric conversion apparatus 1302. The photoelectric conversion apparatus 1302 converts the optical image of the object formed by the optical system 1314 into an electric signal. The photoelectric conversion apparatus 1302 is the photoelectric conversion apparatus according to any of the above embodiments. The image pre-processing unit 1315 performs predetermined signal processing on the signal output from the photoelectric conversion apparatus 1302. The function of the image pre-processing unit 1315 may be built into the photoelectric conversion apparatus 1302. In the photoelectric conversion system 1301, at least two sets of the optical system 1314, the photoelectric conversion apparatus 1302, and the image pre-processing unit 1315 are provided so that outputs from the image pre-processing units 1315 in the respective sets are input to the integrated circuit 1303.

The integrated circuit 1303 is an integrated circuit for an imaging system and includes an image processing unit 1304 including a memory 1305, an optical distance measurement unit 1306, a distance measurement calculation unit 1307, an object recognition unit 1308, and an abnormality detection unit 1309. The image processing unit 1304 performs a development process or image processing such as defect correction on an output signal from each image pre-processing unit 1315. The memory 1305 primarily stores a captured image or stores the position of a defect of an imaging pixel. The optical distance measurement unit 1306 focuses on an object or measures the distance from the object. The distance measurement calculation unit 1307 calculates distance measurement information from a plurality of pieces of image data acquired by the plurality of photoelectric conversion apparatuses 1302. The object recognition unit 1308 recognizes an object such as a vehicle, a road, a sign, or a person. If detecting an abnormality in the photoelectric conversion apparatuses 1302, the abnormality detection unit 1309 informs a main control unit 1313 of the abnormality.

The integrated circuit 1303 may be implemented by hardware designed exclusively for the integrated circuit 1303, or implemented by a software module, or achieved by the combination of these. Alternatively, the integrated circuit 1303 may be implemented by a field-programmable gate array (FPGA) or an application-specific integrated circuit (ASIC), or achieved by the combination of these.

The main control unit 1313 performs overall control of the operations of the photoelectric conversion system 1301, a vehicle sensor 1310, and a control unit 1320. It is also possible to employ a method in which the main control unit 1313 is not included, and the photoelectric conversion system 1301, the vehicle sensor 1310, and the control unit 1320 individually include communication interfaces, and each transmit and receive a control signal through a communication network (e.g., the Controller Area Network (CAN) standard).

The integrated circuit 1303 has the function of transmitting a control signal or a setting value to each photoelectric conversion apparatus 1302 by receiving a control signal from the main control unit 1313 or by a control unit of the integrated circuit 1303.

The photoelectric conversion system 1301 is connected to the vehicle sensor 1310 and can detect the running states, such as the speed, the yaw rate, and the steering angle, of a vehicle in which the photoelectric conversion system 1301 is provided, the environment outside the vehicle, and the states of another vehicle and an obstacle. The vehicle sensor 1310 is also a distance information acquisition unit for acquiring distance information regarding the distance from a target object. The photoelectric conversion system 1301 is also connected to a driving assistance control unit 1311 that performs various types of driving assistance such as automatic steering, automatic cruising, and a collision prevention function. Particularly, regarding a collision determination function, a collision determination unit estimates collision with another vehicle or an obstacle or determines the presence or absence of collision with another vehicle or an obstacle based on the detection result of the photoelectric conversion system 1301 or the vehicle sensor 1310. Consequently, in a case where collision is estimated, avoidance control is performed. Further, when collision occurs, a safety device is activated.

The photoelectric conversion system 1301 is also connected to an alarm device 1312 that gives an alarm to a driver based on the determination result of the collision determination unit. For example, as the determination result of the collision determination unit, if there is a high possibility of collision, the main control unit 1313 applies a brake, returns the gas pedal, or suppresses the engine output, thereby controlling the vehicle to avoid collision and reduce damage. The alarm device 1312 warns a user by setting off an alarm such as a sound, displaying alarm information on a screen of a display unit of an automotive navigation system or a meter panel, or imparting a vibration to the seat belt or the steering.

In the present embodiment, the photoelectric conversion system 1301 captures the periphery, such as the front direction or the rear direction, of the vehicle. FIG. 14B illustrates an example of the placement of the photoelectric conversion system 1301 in a case where the photoelectric conversion system 1301 captures the front direction of the vehicle.

The two photoelectric conversion apparatuses 1302 are disposed in a front portion of a vehicle 1300. Specifically, a center line with respect to the movement direction or the outer shape (e.g., the width) of the vehicle 1300 is regarded as a symmetrical axis, and the two photoelectric conversion apparatuses 1302 are disposed line-symmetrically with respect to the symmetrical axis. This is desirable for acquiring distance information regarding the distance between the vehicle 1300 and an image capturing target object or determining the possibility of collision. It is also desirable to place the photoelectric conversion apparatuses 1302 so as not to block the field of vision of the driver when the driver visually confirms the situation outside the vehicle 1300 from the driver's seat. It is desirable to place the alarm device 1312 so that the alarm device 1312 easily enters the field of vision of the driver.

Next, a failure detection operation of each photoelectric conversion apparatus 1302 in the photoelectric conversion system 1301 will be described with reference to FIG. 15. The failure detection operation of the photoelectric conversion apparatus 1302 is performed according to steps S1410 to S1480 illustrated in FIG. 15.

In step S1410, settings are made when the photoelectric conversion apparatus 1302 starts up. That is, settings for the operation of the photoelectric conversion apparatus 1302 are transmitted from outside the photoelectric conversion system 1301 (e.g., the main control unit 1313) or inside the photoelectric conversion system 1301, and an image capturing operation and a failure detection operation of the photoelectric conversion apparatus 1302 are started.

Next, in step S1420, a pixel signal is acquired from an effective pixel. Further, in step S1430, an output value from a failure detection pixel provided for failure detection is acquired. Similarly to the effective pixel, the failure detection pixel includes a photoelectric conversion unit. A predetermined voltage is written to the photoelectric conversion unit. The failure detection pixel outputs a signal corresponding to the voltage written in the photoelectric conversion unit. Steps S1420 and S1430 may be reversed.

Next, in step S1440, it is determined whether an output expectation value of the failure detection pixel and an actual output value of the failure detection pixel coincide with each other. As a result of the determination in step S1440, if the output expectation value and the actual output value coincide with each other (YES in step S1440), the processing proceeds to step S1450. In step S1450, it is determined that the image capturing operation is normally performed. Then, the processing proceeds to step S1460. In step S1460, the pixel signal in a scan row is transmitted to and primarily saved in the memory 1305. Then, the processing returns to step S1420. In step S1420, the failure detection operation is continued. On the other hand, as a result of the determination in step S1440, if the output expectation value and the actual output value do not coincide with each other (NO in step S1440), the processing proceeds to step S1470. In step S1470, it is determined that there is an abnormality in the image capturing operation. Then, an alarm is given to the main control unit 1313 or the alarm device 1312. The alarm device 1312 performs, on the display unit, display indicating that an abnormality is detected. Then, in step S1480, the photoelectric conversion apparatus 1302 is stopped, and the operation of the photoelectric conversion system 1301 is ended.

In the present embodiment, an example has been illustrated where the flowchart loops with respect to each row. Alternatively, the flowchart may loop with respect to a plurality of rows, or the failure detection operation may be performed with respect to each frame. When an alarm is given in step S1470, the outside of the vehicle 1300 may be notified of the information via a wireless network.

In the present embodiment, a description has been given of control for preventing a vehicle from colliding with another vehicle. Alternatively, the present embodiment is also applicable to control for automatically driving a vehicle by following another vehicle, or control for automatically driving a vehicle so as to stay in a lane. Further, the photoelectric conversion system 1301 can be applied not only to a vehicle such as a vehicle in which the photoelectric conversion system 1301 is provided, but also to a moving body (a moving apparatus) such as a vessel, an aircraft, or an industrial robot. Still further, the photoelectric conversion system 1301 can be applied not only to a moving body but also to a device widely using object recognition, such as an intelligent transportation system (ITS).

A configuration may be employed in which the photoelectric conversion apparatus according to the present invention can further acquire various pieces of information such as distance information.

According to the present disclosure, it is possible to provide a laminated photoelectric conversion apparatus that prevents an excess charge from being mixed in an OB region and detects black level reference signals more accurately.

While the present invention has been described with reference to embodiments, it is to be understood that the invention is not limited to the disclosed embodiments. The scope of the following claims is to be accorded the broadest interpretation so as to encompass all such modifications and equivalent structures and functions.

This application claims the benefit of Japanese Patent Applications No. 2020-181379, filed Oct. 29, 2020, and No. 2021-008443, filed Jan. 22, 2021, which are hereby incorporated by reference herein in their entirety.

What is claimed is:

1. A photoelectric conversion apparatus comprising:
a first substrate having a first semiconductor device layer including a plurality of photoelectric conversion units and a well in which the plurality of photoelectric conversion units is disposed; and
a second substrate having a second semiconductor device layer including a circuit configured to process signals obtained by the plurality of photoelectric conversion units,
wherein the first and second substrates are laminated together,
wherein the first semiconductor device layer includes an effective pixel region having the plurality of photoelectric conversion units, an optical black pixel region provided between the effective pixel region and an end of the first semiconductor device layer and having the plurality of photoelectric conversion units, and an outer periphery region disposed between the optical black pixel region and the end of the first semiconductor device layer,
wherein in a planar view, a light-blocking region formed by a light-blocking layer overlaps the optical black pixel region, and the light-blocking region does not overlap the outer periphery region,
wherein the outer periphery region has a charge draining region including a semiconductor region in which a majority of carriers are carriers of the same conductivity type as a signal charge,
wherein a fixed potential is supplied to the charge draining region,
wherein a pad portion configured to conduct electricity between the photoelectric conversion apparatus and outside is disposed in the outer periphery region,
wherein the charge draining region is disposed between the pad portion and the well,
wherein each of the photoelectric conversion units is an avalanche photodiode, and
wherein a distance between the well and the charge draining region is a distance at which avalanche multiplication does not occur between the well and the charge draining region.

2. The photoelectric conversion apparatus according to claim 1, wherein a conductivity type of the outer periphery region is an N-type, and a positive potential is applied to the charge draining region.

3. The photoelectric conversion apparatus according to claim 1, wherein a conductivity type of the outer periphery region is a P-type, and a ground potential is applied to the charge draining region.

4. The photoelectric conversion apparatus according to claim 1, wherein the light-blocking region overlaps the well and a part of the outer periphery region in a planar view.

5. The photoelectric conversion apparatus according to claim 1, wherein an isolation disposed to penetrate the first semiconductor device layer is disposed between the charge draining region and the pad portion.

6. The photoelectric conversion apparatus according to claim 5, wherein the isolation is a region where an insulating material is embedded.

7. The photoelectric conversion apparatus according to claim 1, wherein a distance between a center of the pad portion and the light-blocking layer is 30 µm or more and 200 µm or less.

8. The photoelectric conversion apparatus according to claim 6, wherein a distance between a center of the pad portion and the light-blocking layer is 30 µm or more and 200 µm or less.

9. The photoelectric conversion apparatus according to claim 1,
wherein each of the photoelectric conversion units is an avalanche photodiode, and
wherein a distance between the well and the charge draining region is 1 µm or more.

10. The photoelectric conversion apparatus according to claim 7,
wherein each of the photoelectric conversion units is an avalanche photodiode, and
wherein a distance between the well and the charge draining region is 1 µm or more.

11. The photoelectric conversion apparatus according to claim 8,
wherein each of the photoelectric conversion units is an avalanche photodiode, and
wherein a distance between the well and the charge draining region is 1 µm or more.

12. The photoelectric conversion apparatus according to claim 9, wherein the pad portion is connected to a wiring layer disposed in the first substrate.

13. The photoelectric conversion apparatus according to claim 1, wherein, in the first semiconductor device layer, a circuit element is not disposed between the pad portion and the well.

14. The photoelectric conversion apparatus according to claim 10, wherein, in the first semiconductor device layer, a circuit element is not disposed between the pad portion and the well.

15. The photoelectric conversion apparatus according to claim 11, wherein, in the first semiconductor device layer, a circuit element is not disposed between the pad portion and the well.

16. A photoelectric conversion system comprising:
the photoelectric conversion apparatus according to claim 1; and
a signal processing unit configured to process a signal output from the photoelectric conversion apparatus.

17. A moving body comprising:
the photoelectric conversion apparatus according to claim 1;
a distance information acquisition unit configured to acquire distance information regarding a distance from a target object based on a signal from the photoelectric conversion apparatus; and
a control unit configured to control the moving body based on the distance information.

* * * * *